(12) United States Patent
Vaganov et al.

(10) Patent No.: US 7,476,952 B2
(45) Date of Patent: Jan. 13, 2009

(54) SEMICONDUCTOR INPUT CONTROL DEVICE

(76) Inventors: Vladimir Vaganov, 129 El Parton, Los Gatos, CA (US) 95032; Nickolai Belov, 118 Plazoleta, Los Gatos, CA (US) 95032

( * ) Notice: Subject to any disclaimer, the term of this patent is extended or adjusted under 35 U.S.C. 154(b) by 45 days.

(21) Appl. No.: 11/804,954

(22) Filed: May 21, 2007

(65) Prior Publication Data

US 2007/0264743 A1    Nov. 15, 2007

Related U.S. Application Data

(63) Continuation-in-part of application No. 11/025,642, filed on Dec. 28, 2004.

(60) Provisional application No. 60/802,276, filed on May 22, 2006.

(51) Int. Cl.
*H01L 23/04* (2006.01)
*H01L 23/48* (2006.01)
*H01L 23/52* (2006.01)
*H01L 23/28* (2006.01)

(52) U.S. Cl. .............. 257/415; 257/730; 257/778; 257/787; 257/E23.123; 257/E23.124

(58) Field of Classification Search .......... 257/E23.001, 257/E23.002, E23.116, E23.123, E23.124, 257/E23.128, E23.18, E23.194
See application file for complete search history.

(56) References Cited

U.S. PATENT DOCUMENTS

| | | | |
|---|---|---|---|
| 4,680,577 A | 7/1987 | Straayer et al. | |
| 4,891,985 A * | 1/1990 | Glenn | 73/514.38 |
| 4,967,605 A | 11/1990 | Okada | |
| 5,035,148 A | 7/1991 | Okada | |
| 5,263,375 A | 11/1993 | Okada | |
| 5,489,900 A | 2/1996 | Cali et al. | |
| 5,499,041 A | 3/1996 | Brandenburg et al. | |
| 5,600,074 A * | 2/1997 | Marek et al. | 73/862.625 |
| 5,640,178 A | 6/1997 | Endo et al. | |
| 5,703,393 A * | 12/1997 | Yamaguchi | 257/419 |
| 5,760,313 A * | 6/1998 | Guentner et al. | 73/862.584 |
| 6,121,954 A | 9/2000 | Seffernick | |
| 6,195,082 B1 | 2/2001 | May et al. | |
| 6,373,265 B1 | 4/2002 | Morimoto et al. | |
| 6,388,299 B1 * | 5/2002 | Kang et al. | 257/415 |
| 6,441,503 B1 * | 8/2002 | Webster | 257/787 |
| 6,477,903 B2 | 11/2002 | Okada | |
| 6,518,954 B1 | 2/2003 | Chen | |
| 6,523,423 B1 | 2/2003 | Namerikawa et al. | |
| 6,530,283 B2 | 3/2003 | Okada et al. | |

(Continued)

*Primary Examiner*—Scott B. Geyer
(74) *Attorney, Agent, or Firm*—Fitch, Even, Tabin & Flannery

(57) ABSTRACT

A force input control device suitable for high-volume applications such as cell phones, portable gaming devices and other handheld electronic devices is disclosed. The device comprises a force sensor die formed within semiconductor substrate and containing a force sensor providing electrical output signal in response to applied external force, connection elements for either flip chip mounting or wire bonding. Signal conditioning and processing integrated circuit is integrated within the device. A package enclosing at least a portion of the force sensor die and comprising a force-transferring element coupled to the sensor die for transferring an external force to the force sensor die. A button, which has multiple ergonomical designs, is mechanically coupled to the force-transferring element of the package for providing an interface with the external force.

35 Claims, 31 Drawing Sheets

U.S. PATENT DOCUMENTS

| | | |
|---|---|---|
| 6,534,711 B1 * | 3/2003 | Pollack ........................ 174/529 |
| 6,570,556 B1 | 5/2003 | Liao et al. |
| 6,642,857 B1 | 11/2003 | Schediwy et al. |
| 6,654,004 B2 | 11/2003 | Hoggarth |
| 6,654,005 B2 | 11/2003 | Wang |
| 6,697,049 B2 | 2/2004 | Lu |
| 6,707,445 B1 | 3/2004 | Hasemann |
| 6,750,408 B2 | 6/2004 | Inoue et al. |
| 6,753,850 B2 | 6/2004 | Poole |
| 6,771,992 B1 | 8/2004 | Tomura et al. |
| 6,774,887 B2 | 8/2004 | Lu |
| 6,787,865 B2 * | 9/2004 | Endo et al. .................. 257/414 |
| 6,788,291 B2 | 9/2004 | Burry |
| 6,809,529 B2 | 10/2004 | Okada et al. |
| 6,809,721 B2 | 10/2004 | Love |
| 6,859,048 B2 | 2/2005 | Okada et al. |
| 6,903,724 B2 | 6/2005 | Grivas et al. |
| 6,920,041 B2 | 7/2005 | Oross et al. |
| 6,940,495 B2 | 9/2005 | Morimoto et al. |
| 6,950,092 B2 | 9/2005 | Buss |
| 6,952,197 B1 | 10/2005 | Nakamura et al. |
| 7,262,071 B2 * | 8/2007 | Larmer et al. .................. 438/53 |
| 7,273,767 B2 * | 9/2007 | Ong et al. .................... 438/113 |
| 2001/0003326 A1 | 6/2001 | Okada et al. |
| 2002/0075234 A1 | 6/2002 | Poole |
| 2002/0149564 A1 | 10/2002 | Simpson et al. |
| 2002/0151282 A1 | 10/2002 | Wang |
| 2002/0190949 A1 | 12/2002 | Hirano et al. |
| 2003/0030452 A1 | 2/2003 | Okada |
| 2003/0052861 A1 | 3/2003 | Peng |
| 2003/0076302 A1 | 4/2003 | Langstraat |
| 2003/0105076 A1 | 6/2003 | Ansari et al. |
| 2004/0027331 A1 | 2/2004 | Mochizuki et al. |
| 2004/0222968 A1 | 11/2004 | Endo |
| 2004/0227732 A1 | 11/2004 | Kemppinnen |
| 2005/0178214 A1 | 8/2005 | Okada et al. |
| 2005/0190152 A1 * | 9/2005 | Vaganov ...................... 345/157 |

* cited by examiner (a)

(b)

(a)

(b)

SEMICONDUCTOR INPUT CONTROL DEVICE

CROSS REFERENCES TO RELATED APPLICATIONS

This application claims the benefit of U.S. provisional application 60/802,276, filed May 22, 2006 and which is incorporated herein by reference in its entirety and for all purposes. This application is also a Continuation In Part to patent application Ser. No. 11/025,642 filed Dec. 28,2004.

BACKGROUND OF THE INVENTION

1. Field of the Invention

This invention relates to semiconductor input control devices, Micro Electro Mechanical Systems (MEMS), sensors and more specifically to one (1D), two (2D) and three dimensional (3D) force sensors for multiple applications and in particular for finger-mouse and micro-joysticks for consumer and other applications.

2. Background

The 3D force sensors based on micromachined silicon chips with stress sensitive components on the flexible diaphragm are known. Prior art uses silicon chip with stress sensitive components bonded to metal elastic element with metal rod or pin for application of an external force. The packages for these force sensors are generally complex, large and expensive.

However there is a need for 3-dimensional input force control devices, which are low cost, small, reliable, stable, provide selected ratios between X,Y,Z sensitivities, low cross axis sensitivity, process integration with CMOS, scaling, convenient solutions for applying an external force, selectable combination of applied force and deflection and manufacturability for high volume applications. The examples of this are consumer markets and applications such as cell phones, portable gamers, digital cameras, etc, using user tactile force inputs as part of the user interface.

SUMMARY OF THE PRESENT INVENTION

A low-cost force input control device suitable for high-volume applications such as cell phones, portable gaming devices and other handheld electronic devices is disclosed.

This device comprises a force sensor die formed within semiconductor substrate and containing a force sensor providing electrical output signal in response to applied external force, connection elements for either flip chip mounting or wire bonding; at least one signal conditioning and processing integrated circuit providing conditioning and processing of the output signals from the force sensor; a package enclosing at least a portion of the force sensor die and comprising a force-transferring element coupled to the sensor die for transferring an external force to the force sensor die; and a button mechanically coupled to the force-transferring, element of the package for providing an interface with the external force.

DETAILED DESCRIPTION OF THE PREFERRED EMBODIMENTS

An object of the present invention is to provide a 3-dimensional force input control device for high volume consumer markets, such as cell phones, portable gamers, remote controls, PDA, digital cameras, etc.

Another object of the present invention is to provide packaging solutions of 3-dimensional force input control of different functions in electronic consumer devices.

Another object of the present invention is to provide a low cost 3-dimensional force input control device.

Another object of the present invention is to provide a small size 3-dimensional force input control device.

Another object of the present invention is to provide a high reliability 3-dimensional force input control device.

Another object of the present invention is to provide a high stability 3-dimensional force input control device.

Another object of the present invention is to provide a 3-dimensional force input control device, which is scalable.

Another object of the present invention is to provide a 3-dimensional force input control device, which allows convenient solutions for applying an external force.

Another object of the present invention is to provide a 3-dimensional force input control device, which allows selectable combinations of applied force and deflection.

FIGS. 1-31 show various embodiments of force input control devices, their different options of packaging and their assembling and mounting methods. The detailed description of the microstructures, devices and methods of fabrication according to the present invention are presented below in twelve embodiments.

First Embodiment

Figure 1:
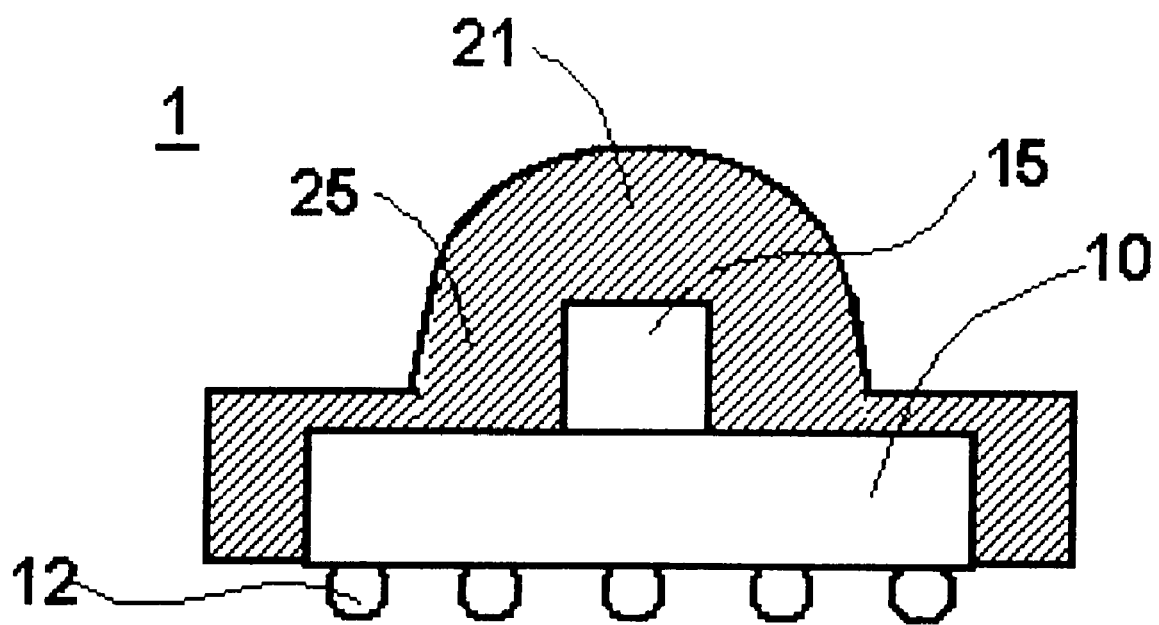
FIG. 1 is a view of a 3D force input control device with flip-chip force-sensor die without substrate and with direct button molding.

An example of an input device 1 according to the first embodiment is shown in FIG. 1. The input device 1 contains a package 25, a semiconductor force sensor die 10, and a force-transferring element 21. The force sensor die has a rigid force-transferring element 15. The rigid force-transferring element 15 of the die 10 is mechanically coupled to the force-transferring element 21 of the package 25. The element 21 is made from one or more plastic materials. For example, one layer uniform material, at least two layers of uniform materials, non-uniform plastic material with gradient of hardness or combination of the above can be used in fabrication of the force-transferring element 21. These and other options are further described below in detail. The input device 1 also has connection elements 12 for both electrical and mechanical connection to a substrate or other type of board or component used in an electronic system. The connection elements 12 can be solder balls, solder bumps or pads covered with under-bump metallization suitable for flip-chip mounting. The connection elements 12 are formed on the force sensor die 10. The package 25, therefore, contains only a portion of the force sensor die 10. The sensor die 10 contains force sensors transforming force applied to the sensor die 10 into an electrical signal. Signal conditioning electronics also can be integrated on the force sensor die 10.

An external force is, applied to a force-transferring part 21 of the package 25, for example, by a finger. The applied force is transferred to the rigid force-transferring element 15 of the force sensor die 10 through the force-transferring element 21 of the package 25. The force sensor die 10 provides output signal in response to the applied force. This signal can be used as an input signal in an electronic system. For example, the output signal of the force sensor die 10 can be used for cursor position control on a screen of a cell phone, control of motion or actions of a character in a gaming device, monitoring a patient, control of sport equipment, etc. Output signal of the force sensor die 10 can carry information to allow, for example, 2D, 3D or more complex control of a cursor or other object at user interface.

Figure 2:
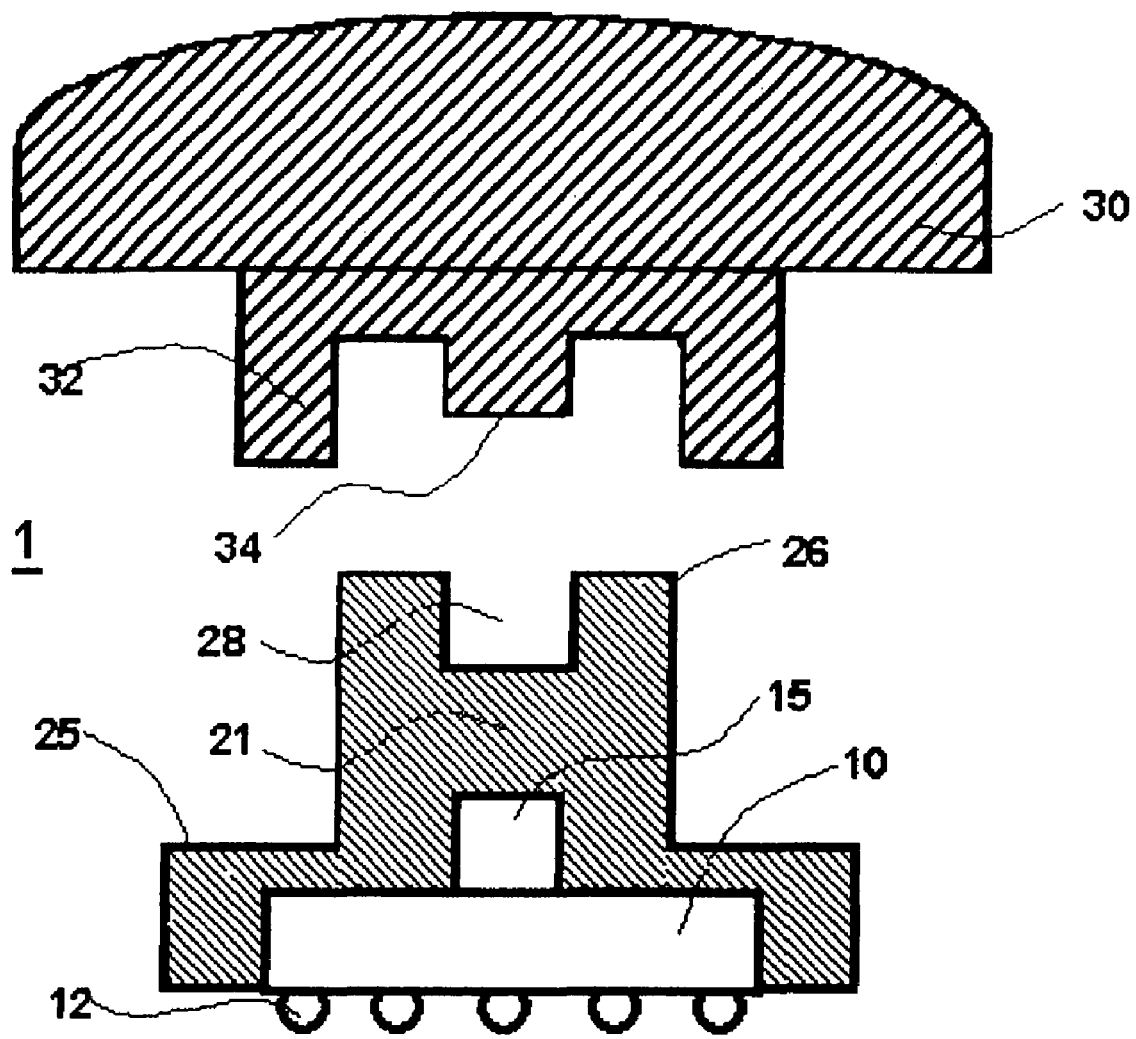
FIG. 2 is a view of a 3D force input control device with flip-chip force-sensor die without substrate and with an external button attaching to a force-transferring element of the package.

FIG. 2 shows another example of input device 1 according to the first embodiment. The input device 1 contains a package 25, a semiconductor force sensor die 10, and a button 30. The force sensor die has a rigid force-transferring element 15 located inside the package 25. The package 25 has a force-transferring element 21. The rigid force-transferring element 15 of the force sensor die 10 is mechanically coupled to the force-transferring element 21 of the package 25. The input device 1 has also connection elements 12 for both electrical and mechanical connection to a substrate or other type of board or component used in an electronic system. The connection elements 12 can be solder balls, solder bumps or pads covered with under-bump metallization suitable for flip-chip mounting. The connection elements 12 are formed on the force sensor die 10. The package 25, therefore, contains only a portion of the force sensor die 10.

The button 30 is connected to the package 25. The button 30 can be made from different materials, such as plastic, metal, ceramic, glass, polymer, gem or combination of the above. The button 30 can have different shapes and elements, such as convex, concave, saddle, cylinder, disk, dome, stick, hemisphere, cone, pyramid, prism, tore, dimple, notch, tactile recognizable feature, or combination. Both the package 25 and the button 30 have profiled connector elements 26, 28, 32, and 34, which provide reliable connection between the button and the package 25. In particular, the force-transferring element 21 and the button 30 can be coupled across a surface having a shape of hole, cavity, trench, notch, pole, pin, rim, step, bar, thread, tooth, hook, or combination of the above. In a version of the input control device profiled connectors formed in the button 30 and force-transferring element 21 have a locking mechanism. Profiled connector elements 26, 28, 32, and 34 also provide protection of the force sensor die 10 from both force and torque overload. Button 30 is designed ergonomically to provide the maximum convenience for the user providing preferable material, shape, size, range of the force required to operate the input device, stiffness, maximum deformation, feeling in touch, and color. Input device 1 can be a part of a keyboard, key-mat, control panel or control surface area. Buttons also can be replaceable and interchangeable.

An external force is applied to the button 30, for example by a finger, and then it is transferred to the force sensor through the force-transferring element 21 of the package 25 and rigid force-transferring element 15 of the force sensor die 10. The force sensor die 10 provides output signal in response to the applied force. This signal is used as an input signal in an electronic system. Output signal of the force sensor die 10 has multiple components and allows, for example, 2D control of a cursor or 3D control of a gaming character or other object at user interface.

It should be understood that different mechanical parameters, such as force and torque, can be applied to the input control device. In this patent application all mechanical parameters applied to the device for input control are defined as mechanical signals.

Second Embodiment

Figure 3:
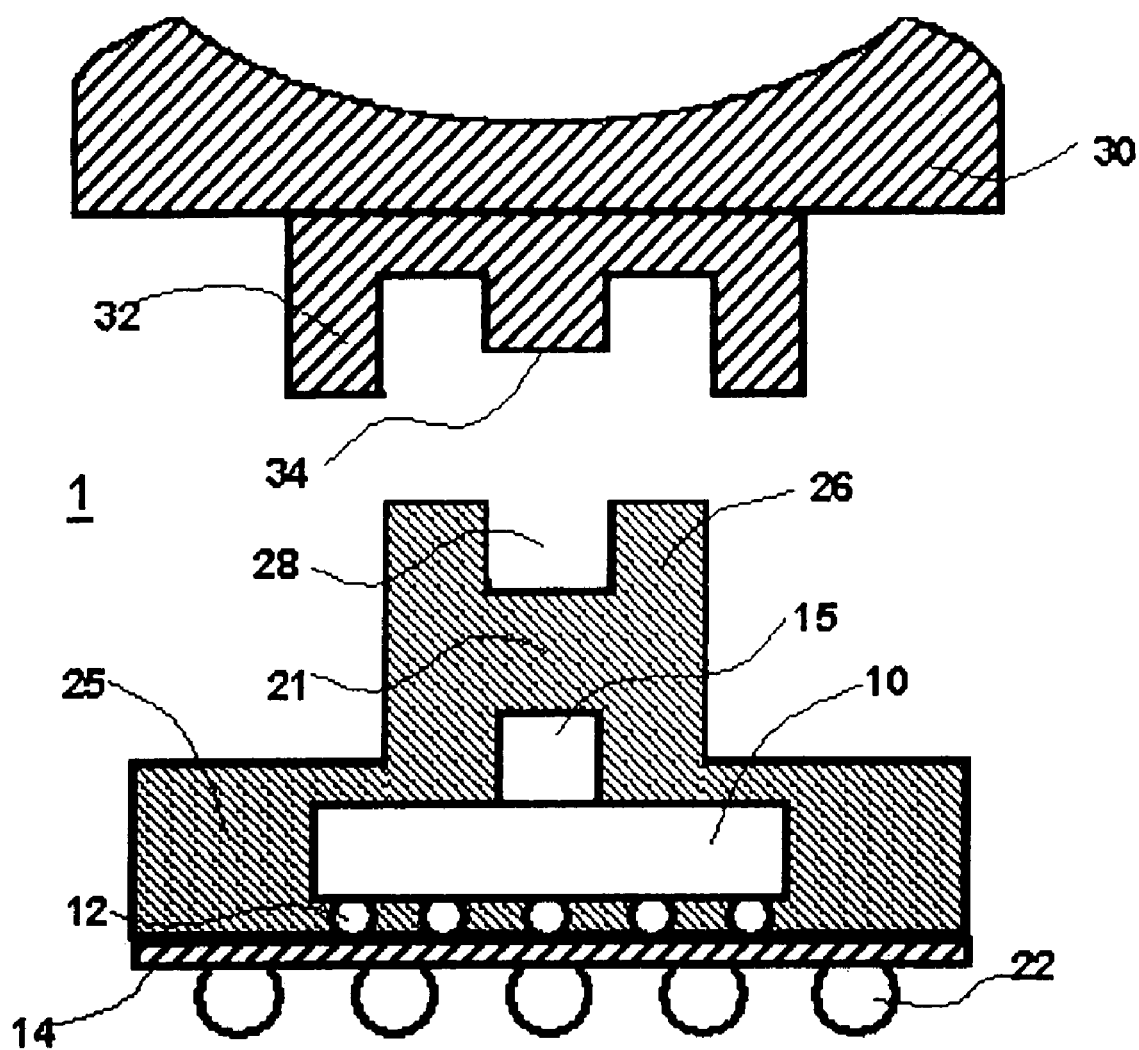
FIG. 3 is a view of a 3D input control device with flip-chip force-sensor die mounted on a Ball Grid Array (BGA) substrate and with an external button attaching to a force-transferring element of the package.
Figure 4:
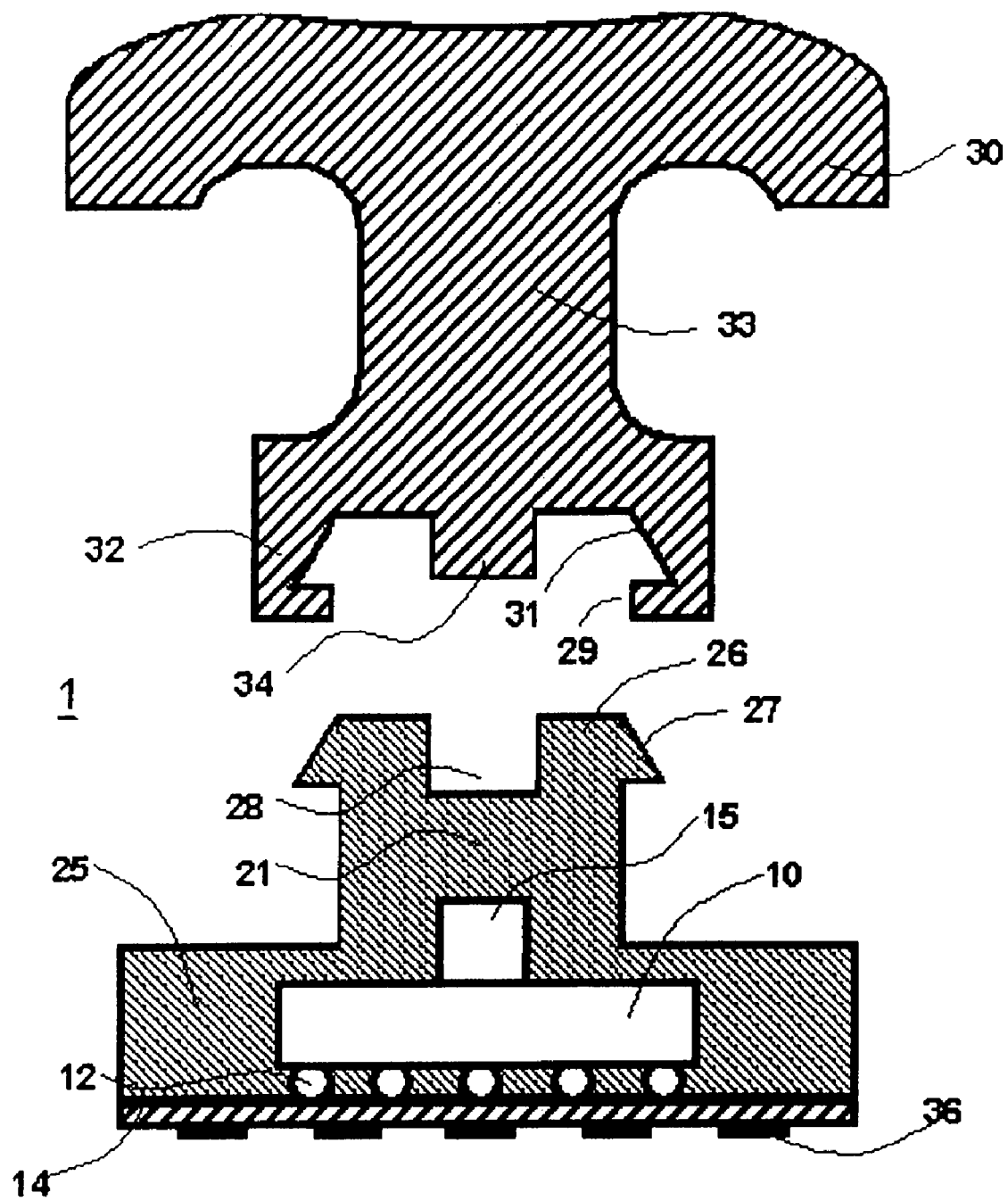
FIG. 4 is a view of a 3D input control device with flip-chip force-sensor die mounted on a Land Grid Array (LGA) substrate and with an external stick-shaped button attaching to a force-transferring element of the package.

FIGS. 3 and 4 show examples of input device 1 according to the second embodiment. The input device 1 contains a package 25, including a substrate 14, a semiconductor force sensor die 10, and an optional button 30. A force sensor die 10 having rigid force-transferring element 15 is located inside the package 25. The package 25 has a force-transferring element 21, which is mechanically coupled to the rigid force-transferring element 15 of the force sensor die 10. The force sensor die 10 is flip-chip mounted on the substrate 14 with connection elements 12, which provide both electrical and mechanical connection of the force sensor die 10 to the substrate 14. The substrate 14 has connection elements 22 for both electrical and mechanical connection to another substrate, board or component used in electronic system. Preferably, automated flip-chip mounting is used both in assembly of the input device 1 and for mounting it in electronic system. The connection elements 12 and 22 can be solder balls, solder bumps or pads covered with under-bump metallization suitable for flip-chip mounting. Input device 1 shown in FIG. 3 has a set of connection elements 22 forming a ball-grid array (BGA). Input device 1 shown in FIG. 4 has a set of connection elements 22 forming a land-grid array (LGA). Both the package 25 and button 30 have profiled connector portions 26, 28, 32, and 34, which provide reliable connection between the button and the package 25. The design of the profiled connector portions 26, 28, 32, and 34 allows protection of the force sensor die 10 from both force and torque overload. Button 30 is designed ergonomically to provide the maximum convenience for the user. Button 30 can be an interchangeable part. The input control device 1 also can be a part of a keyboard, a key-mat, control panel or control surface area.

An external force is applied to the button 30, for example by a finger, and then it is transferred to the force sensor die 10 through the force-transferring element 21 of the package 25 and rigid force-transferring element 15 of the force sensitive die 10. The force sensor die 10 provides output signal in response to the applied force. This signal is used as an input signal in an electronic system. Output signal of the force sensor die 10 has multiple components and allows controlling different functions, such as 2D cursor control or 3D control of a gaming object, scrolling and zooming, etc. The input device 1 provides both micro-mouse and micro-joystick functionality, when used for cursor control or game control applications.

For some applications, for example gaming or medical rehabilitation, a relatively large deflection of force-transferring element is required. The challenge of using described above input force control devices for such applications is that deflection of the rigid force-transferring element 15 of the die 10 and deflection of the force-transferring element 21 of the package 25 and therefore deflection of the button 30 are negligible.

The embodiment design resolving this issue is illustrated in FIG. 4 according to a second embodiment. A button 30 incorporates springy flexible element 33, which increases the range of motion in response to the applied force and improves quality of input control. As another benefit, the spring element 33 also increases the range of the opportunities in designing the microstructure of the sensor die for better performance from variable stiffness, reliability and cost. The drawback of this solution is larger height of the micro-joystick.

FIG. 4 also illustrates an example of different, compared to FIGS. 2 and 3, connector part of the button 30. Both the package 25 and the button 30 have profiled connector portions 26, 27, 28, and 29, 31, 32, 34, which provide reliable connection between the button and the package 25. In this case the connector can provide self-locking mechanism between the button 30 and the force-transferring element 21 of the package 25. The design of the profiled connector portions 26, 27, 28, 29, 31, 32, and 34 also provides protection of the force sensor die 10 from both force and torque overload. Button 30 can have different designs in shape, size, etc.

Third Embodiment

Figure 5:
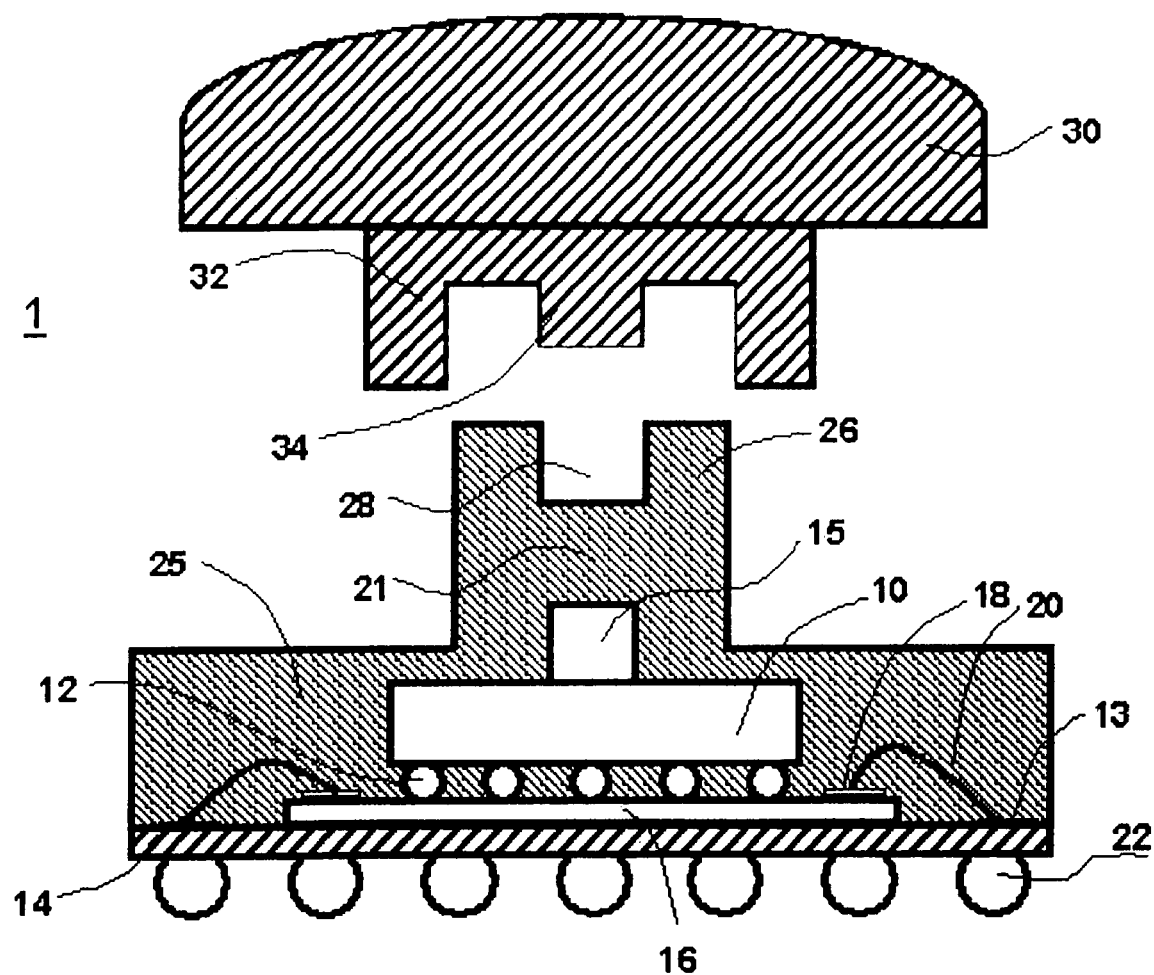
FIG. 5 is a view of a 3D input control device with flip-chip force-sensor die and a wire bonded ASIC stacked on a BGA substrate.
Figure 6:
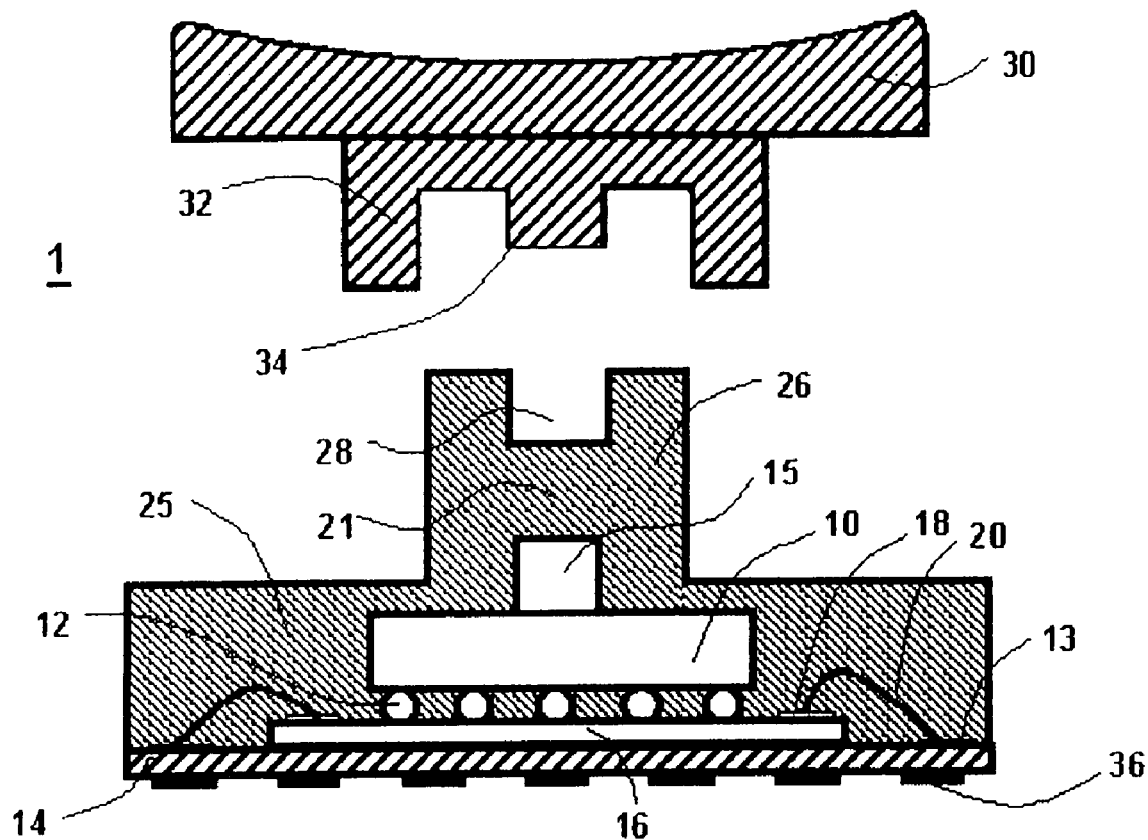
FIG. 6 is a view of a 3D input control device with flip-chip force-sensor die and a wire bonded ASIC stacked on a LGA substrate.

FIGS. 5 and 6 show examples of input device 1 according to the third embodiment. The input device 1 contains a package 25, including a substrate 14, a force sensor die 10, an ASIC die 16, and a button 30. The package has a force-transferring element 21 coupled with the rigid force-transferring element 15 of the sensor die. The force sensor die 10 is flip-chip mounted on the ASIC die 16 with help of connection elements 12, which provide both electrical and mechanical connection of the force sensor die 10 to the ASIC die 16. The ASIC die 16 is mechanically and electrically connected to the substrate 14. Mechanical connection of the ASIC die to the substrate 14 can be provided either with help of an adhesive or other structural layer. Electrical connection between the ASIC die 16 and the substrate 14 is achieved with help of wire bonding. Wires 20 connect bond pads 18 located on the ASIC die 16 to the bond pads 13 located on the substrate 14. The substrate 14 has connection elements 22 for both electrical and mechanical connection to another substrate, board or component used in an electronic system. Both the connection elements 12 used for flip-chip mounting of the force sensor die 10 on top of the ASIC die 16 and connection elements 22 used for mounting of the input device 1 in an electronic system can be solder balls, solder bumps or pads covered with under-bump metallization suitable for flip-chip mounting. Input device 1 shown in FIG. 5 has a set of connection elements 22 forming a ball-grid array (BGA). Input device 1 shown in FIG. 6 has a set of connection elements 22 forming a land-grid array (LGA).

Both the package 25 and button 30 have profiled connector portions 26, 28, 32, and 34, which provide reliable connection between the button 30 and the package 25 similar to described in the previous embodiments.

Fourth Embodiment

Figure 7:
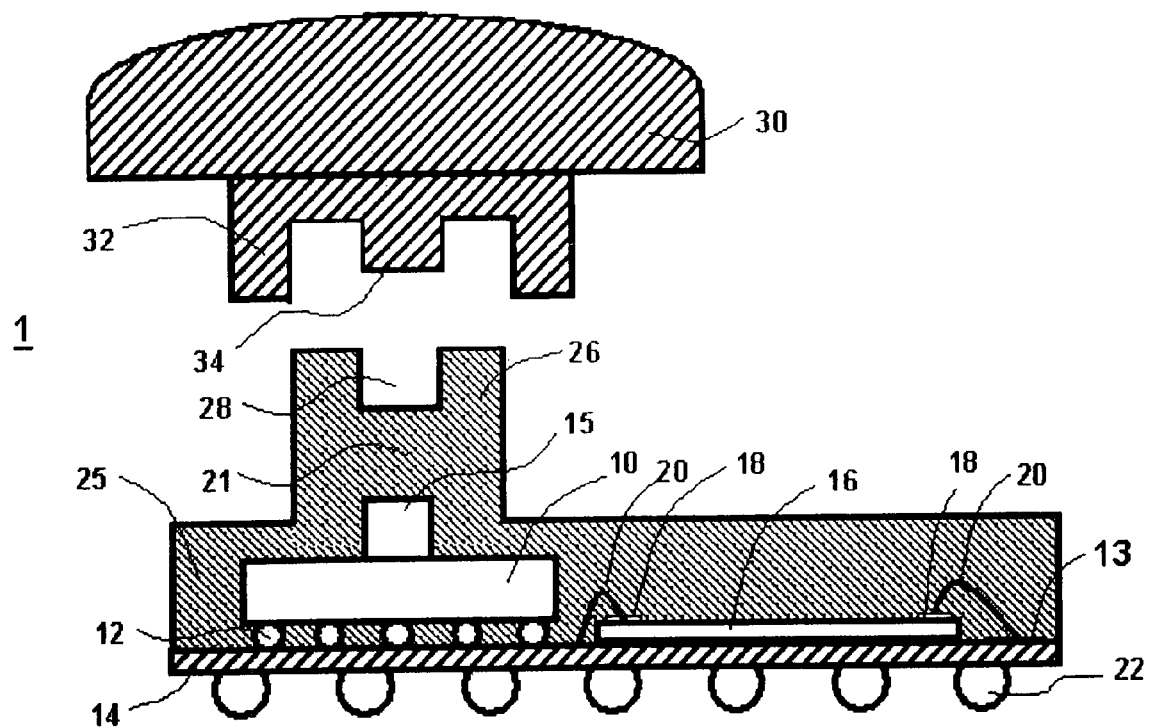
FIG. 7 is a view of a 3D input control device with flip-chip force-sensor die and a wire bonded ASIC located in one plane on a BGA substrate.
Figure 8:
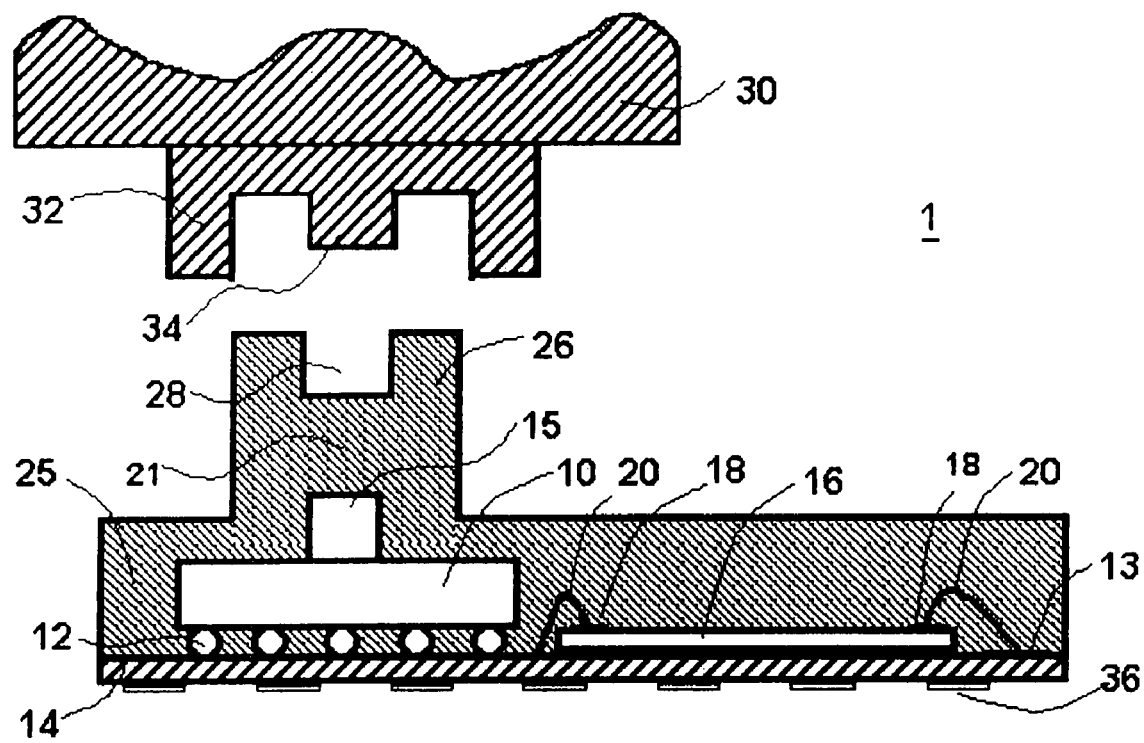
FIG. 8 is a view of a 3D input control device with flip-chip force-sensor die and a wire bonded ASIC located in one plane on a LGA substrate.
Figure 9:
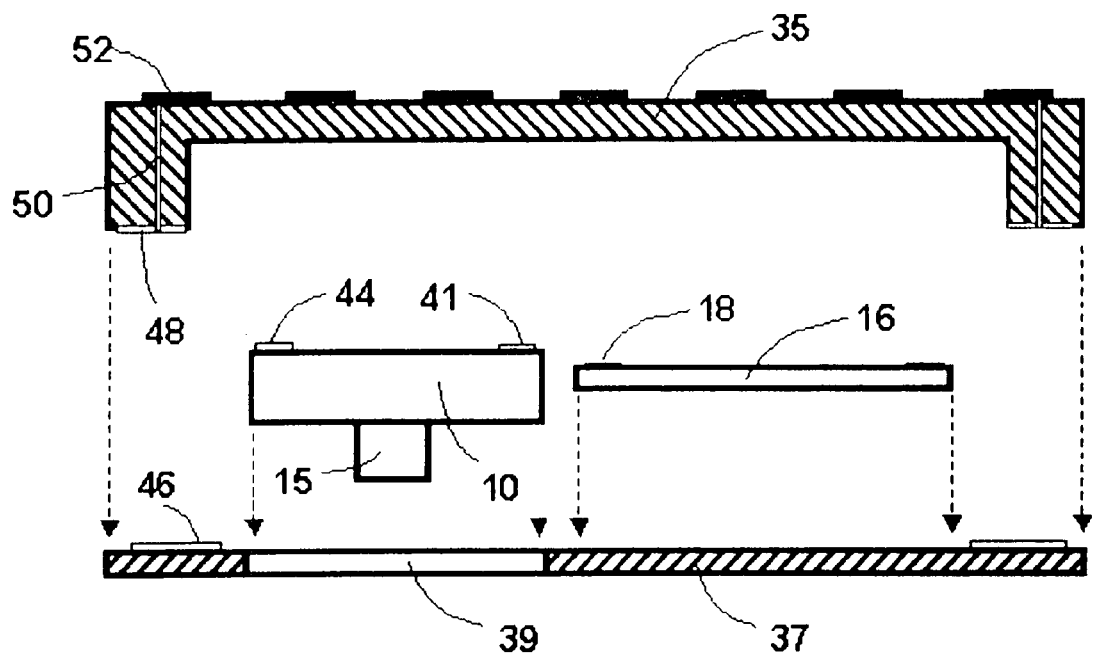
FIG. 9 is a view of a 3D input control device with a wire bonded force-sensor die mounted on a PCB-like substrate with a through-hole and a wire bonded ASIC located in one plane on the same substrate, which is also mechanically and electrically connected to a cap covering dice and comprising external contact pads.
Figure 9:
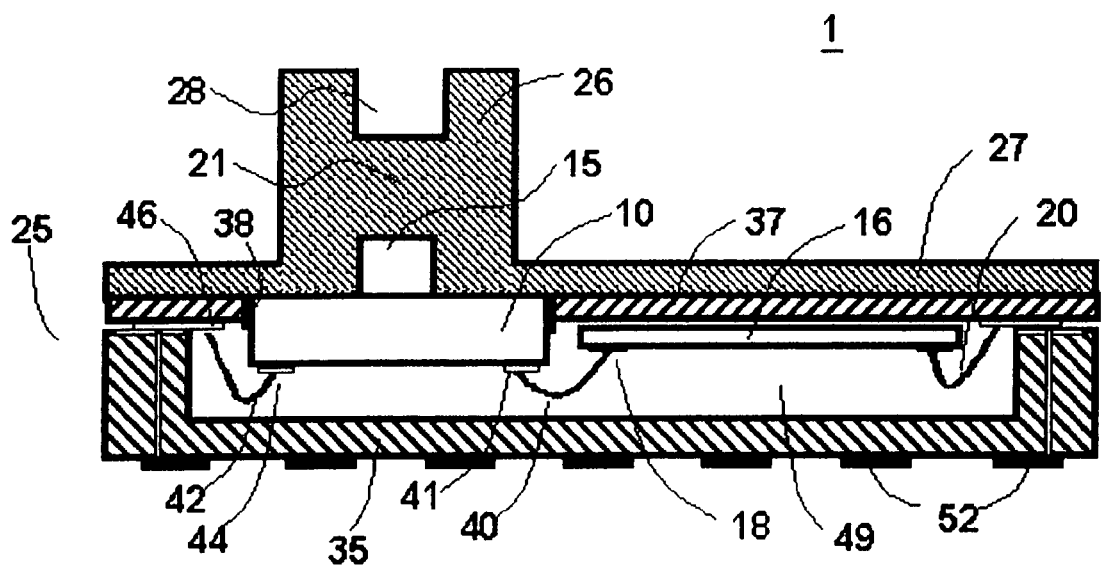

FIGS. 7 and 8 show examples of input device 1 according to the fourth embodiment. The input device 1 contains a package 25, including a substrate 14, an ASIC die 16 and a semiconductor force sensor die 10, and a button 30. The package 25 has a force-transferring element 21 coupled with the rigid force-transferring element 15 of the force sensor die 10. The force sensor die 10 is flip-chip mounted on the substrate 14 with help of connection elements 12. The ASIC die 16 is also mechanically and electrically connected to the substrate 14. Electrical connection between the ASIC die 16 and the substrate 14 is provided with help of wire bonding. Wires 20 connect bond pads 18 located on the ASIC die 16 to the bond pads 13 located on the substrate 14. The substrate 14 has connection elements 22 for both electrical and mechanical connection to another substrate, board or component used in an electronic system. Input device 1 shown in FIG. 7 has a set of connection elements 22 forming a BGA. Input device 1 shown in FIG. 8 has a set of connection elements 22 forming a LGA. Both the package 25 and button 30 have profiled connector portions 26, 28, 32, and 34, which provide reliable connection between the button and the package 25, as described in the previous embodiments.

In a version of the fourth embodiment the ASIC die 16 can be flip-chip mounted on the substrate 14. In this case the ASIC die 16 can have solder balls, solder bumps or metallization that allows flip-chip mounting.

Fifth Embodiment

FIGS. 9, 10, 11, and 12 show examples of input device 1 according to the fifth embodiment. FIG. 9a shows an exploded view of the input device 1. The input device 1 shown in FIG. 9a comprises a die-mounting board 37, a cap 35, a force sensor die 10 having rigid force-transferring element 15, and an ASIC die 16. The die-mounting board 37 has an opening 39 and bond pads 46. The die-mounting board 37 can be, for example, a printed circuit board. The cap 35 has conductive pads 52 and connection elements 48 facing the die-mounting board 37. The conductive pads 52 and the connection elements 48 are electrically connected by conductors 50. The conductors 50 can be metallized vias or other type of connectors known in the art. A force sensor die 10 and an ASIC die 16 are located inside the volume defined by the die-mounting board 37 and the cap 35. Rigid force-transferring element 15 of the force sensor die 10 is facing the opening 39 in the die-mounting board 37. Force sensor die 10 has bond pads 41 and 44 located on the side facing the cap 35. ASIC die 16 has bond pads 18 on the side facing the cap 35.

FIG. 9b shows assembled input device 1. The package 25 is formed by mechanical and electrical connection of the die-mounting board 37, the cap 35 and force-transferring element 21. Mechanical connection between the board 37 and the cap 35 is provided with help of an adhesive, solder, frit glass or other structural material. In a version of the fifth embodiment the mechanical connection between the die-mounting board 37 and the cap 35 is achieved without depositing an additional material on either of the die-mounting board 37 or the cap 35, for example by thermo-compression or welding. Electrical connection between the die-mounting board 37 and the cap 35 is achieved by establishing electrical contact between pads 46 of the die-mounting board 37 and connection elements 48 of the cap 35. The force sensor die 10 and the ASIC die 16 are located inside the package 25. The cap 35 provides mechanical and environmental protection of the wires 20, 40, 42 and metallization 41, 44, 18 on the force sensor die 10 and the ASIC die 16. After assembly operations the cap 35 and the die mounting plate 37 with the force sensor die 10 form an internal cavity 49.

The force sensor die 10 is mechanically and electrically connected to the die-mounting board 37. Electrical connection can be provided by wire bonding: bond pads 44 of the force sensor die 10 are connected with help of wires 42 to pads 46 on the die-mounting board 37. Mechanical connection of the force sensor die 10 to the die-mounting board 37 is provided by a connection layer 38. Connection material can be either an adhesive or other structural material, for example, frit glass. Connection area is located either on the sidewalls of the force sensor die 10 or on the side of the die facing the opening 39 or in both areas. The ASIC die 16 is also mechanically and electrically connected to the die-mounting board 37. Mechanical connection of the ASIC die to the die-mounting board 37 is provided either with help of an adhesive or by another structural layer. Electrical connection between the ASIC die 16 and the die-mounting board 37 is provided with help of wire bonding. Wires 20 connect ASIC bond pads 18 to the bond pads 46 located on the die-mounting board 37. In a version of the embodiment the ASIC die 16 is also electrically connected directly to the force sensor die 10 by wires 40, which connect ASIC bond pads 18 to the bond pads 41 located on the force sensor die 10.

The package 25 further comprises a force-transferring element 21 and an optional cover layer 27, both of which are shown in FIG. 9b. Both the force-transferring element 21 and the cover layer 27 are connected to the external surface of the die-mounting board 37. The force-transferring element 21 is also coupled to the rigid force-transferring element 15 of the force sensor die 10 through the opening 39. Both the force-transferring element 21 and the cover layer 27 are formed using a molding process. Other techniques known in the art also can be used. The conductive pads 52 can be used for both electrical and mechanical connection of the input device 1 to another substrate, board or component used in an electronic system. The conductive pads 52 can be solder balls, solder bumps or pads covered with under-bump metallization suitable for flip-chip mounting.

Figure 10:
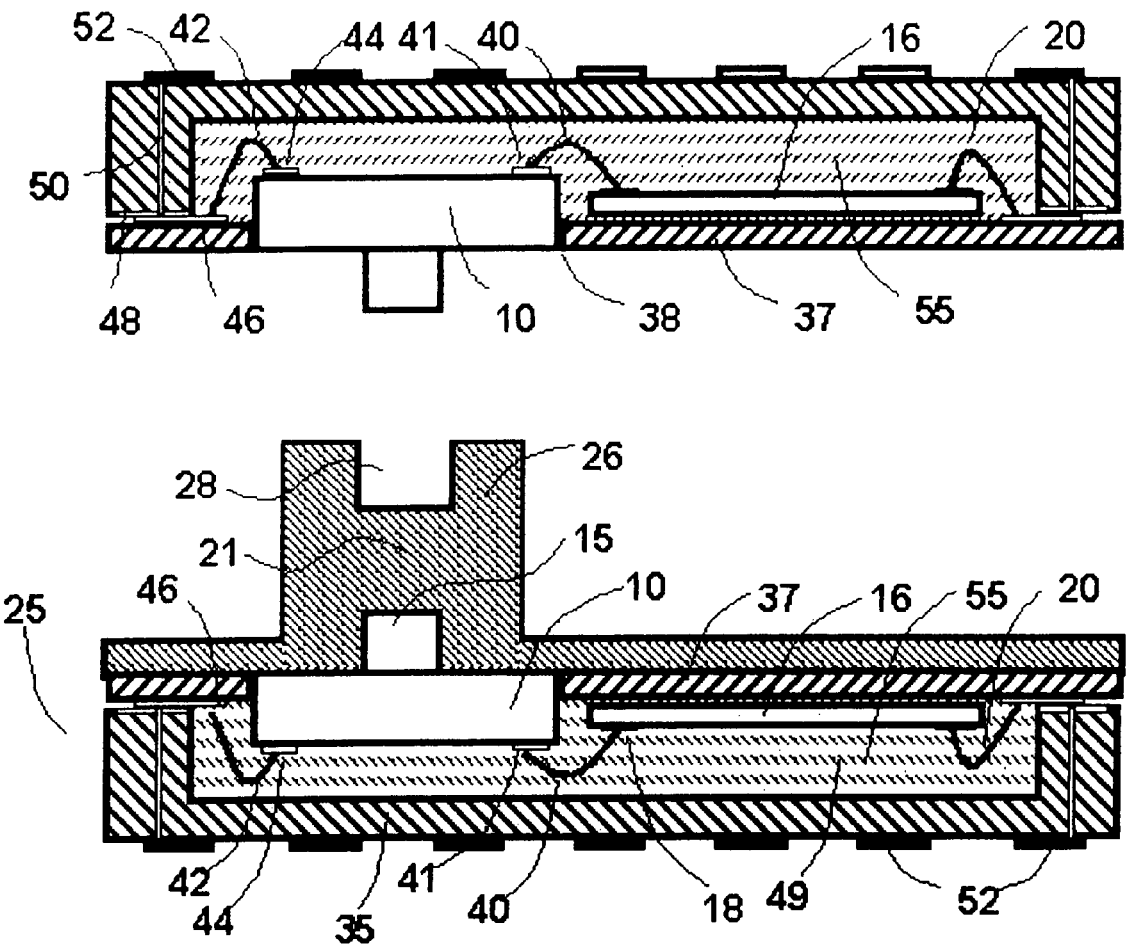
FIG. 10 is a view of a similar to FIG. 9 device with internal cavity between the substrate and the cap filled in with protecting plastic material.
Figure 11:
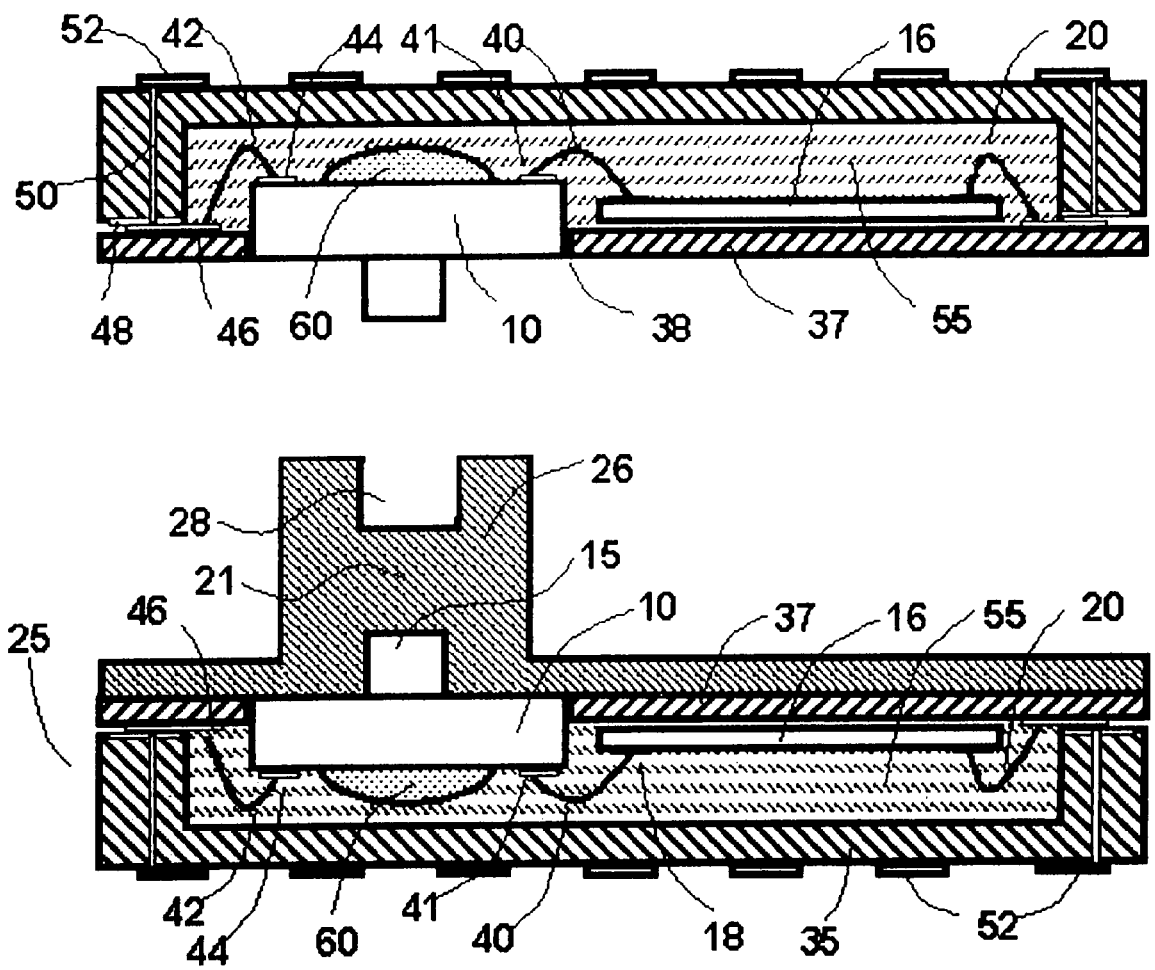
FIG. 11 is a view of a similar to FIG. 10 device with additional gel blob on the surface of the sensor die.
Figure 12:
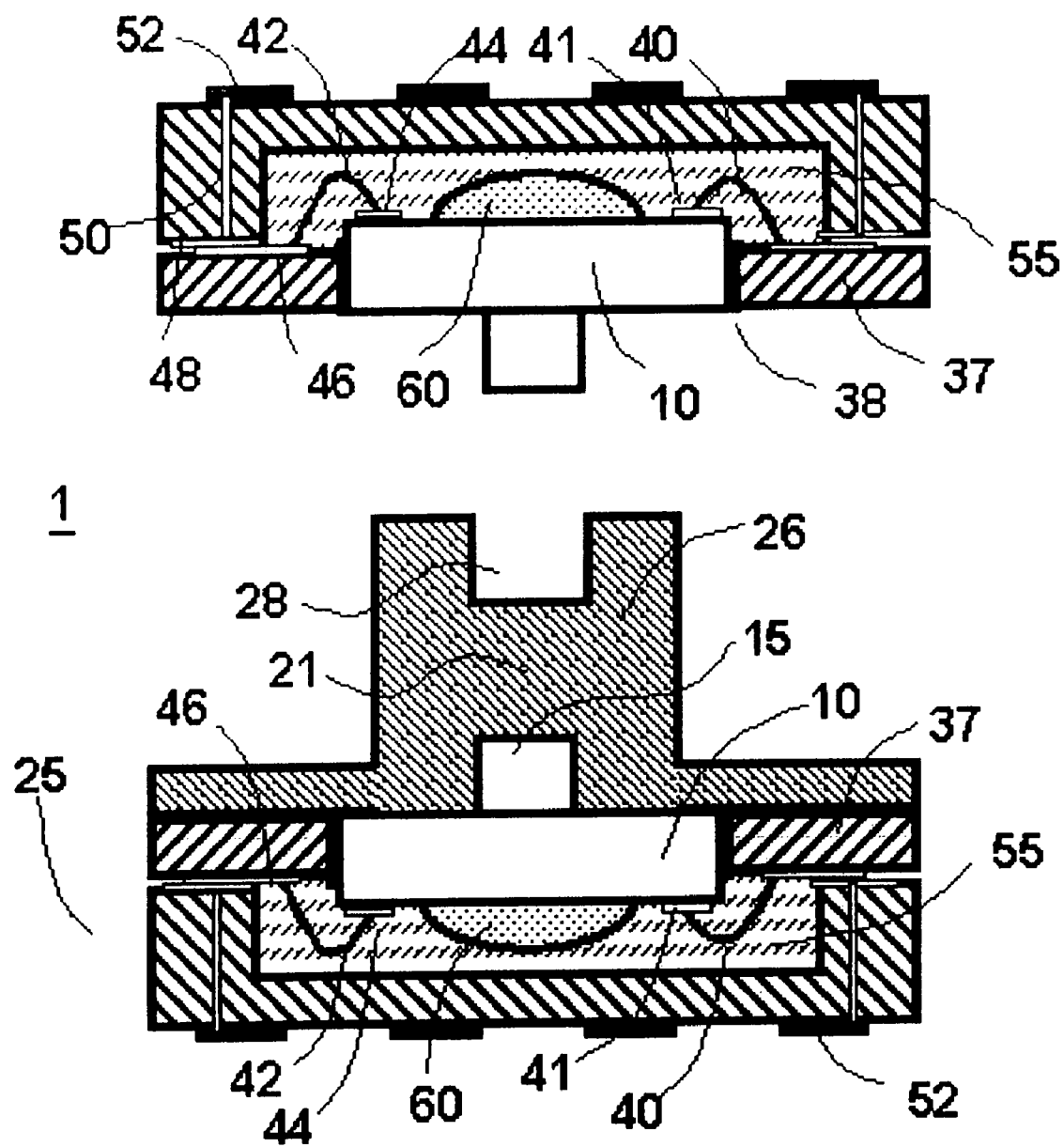
FIG. 12 is a view of a 3D input control device with a wire bonded integrated with ASIC force-sensor die mounted on a PCB-like substrate, which is also mechanically and electrically connected to a cap and filled in with plastic material and additional gel blob on the surface of the sensor die.

The internal cavity 49 can be filled-in with a material 55 as it shown in FIG. 10. The side with the bond pads of the force sensor die 10 can also be protected by a material other than fill-in material. For example, FIG. 11 shows a force sensor die 10 protected with a blob of gel 60.

Electronic circuits required for conditioning and processing of the signal of the force sensors can be integrated on the force sensor die 10. This allows eliminating the ASIC die. A version of the input device 1 according to the fifth embodiment presented in FIG. 12 does not contain the separate ASIC die.

Sixth Embodiment

Figure 13:
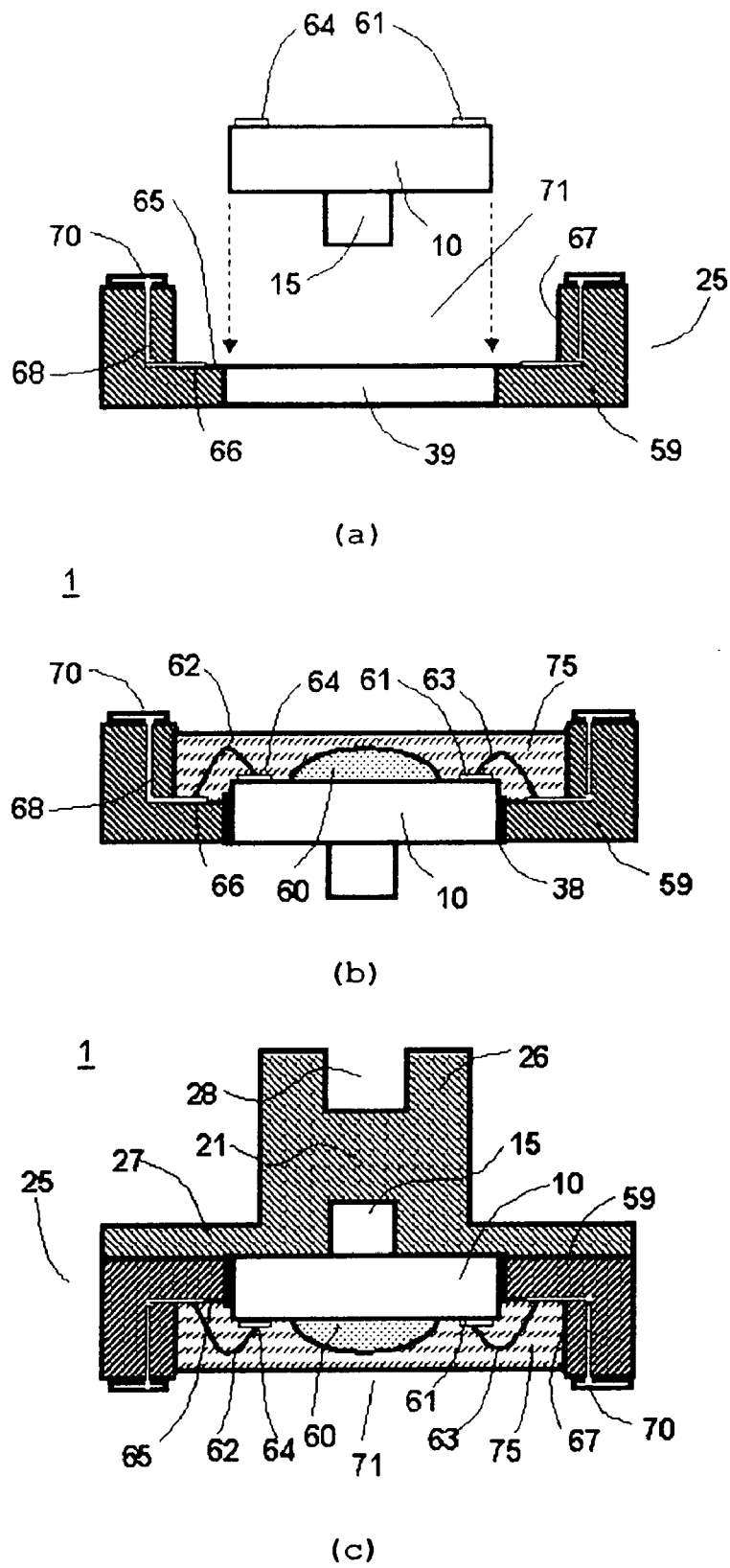
FIG. 13 is a view of a 3D input control device with a wire bonded force-sensor die mounted within ceramic package and having a gel blob on the surface of the die and with potted cavity of the package.
Figure 14:
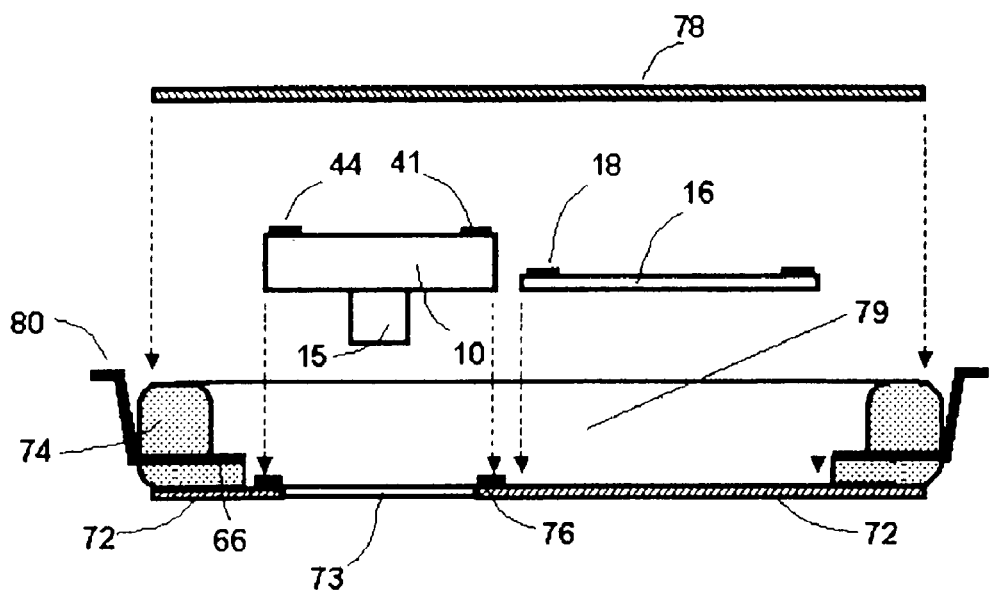
FIG. 14 is a view of a 3D input control device with a wire bonded force-sensor die mounted on a metal substrate with a through-hole and an ASIC wire bonded to the external leads and a cap covering dice.
Figure 14:
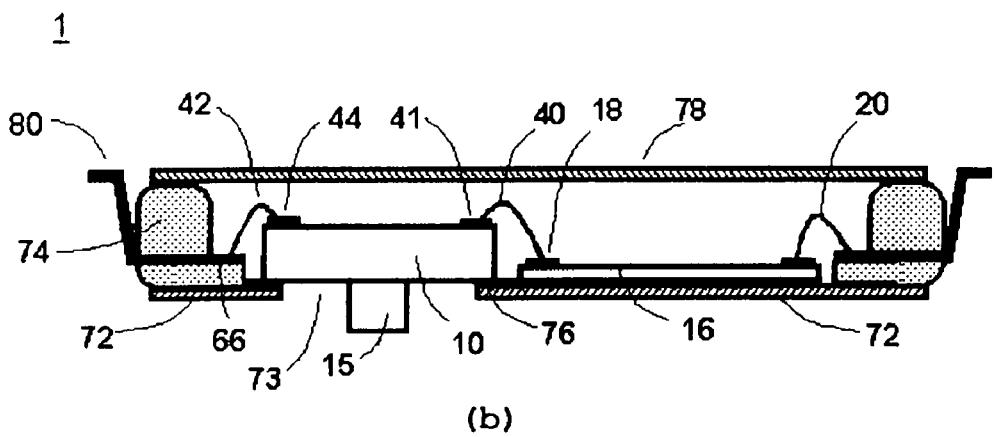
Figure 14:
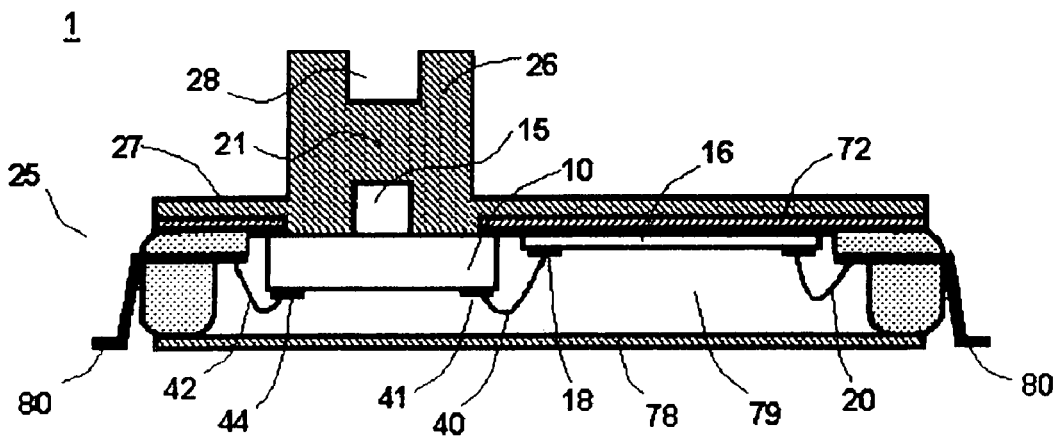

FIG. 13 shows an example of input device 1 according to the sixth embodiment. A package 25 of the input device 1 shown in FIG. 13 comprises a body 59. The body 59 of the package 25 has a bottom part 65 with an opening 39, sidewalls 67, bond pads 66 and external connection elements 70. Sidewalls 67 and bottom part 65 of the package 25 form a cavity 71. External connection elements 70 are located on the top of the sidewalls 67. Bond pads 66 are located on the bottom part of the body 65. They are electrically connected to the external connection elements 70 with help of conductors 68. The conductors 68 can be buried inside the body 59 of the package 25. The conductors 68 can be patterned metal layers, metallized vias or other type of connectors known in the art. A force sensor die 10 is located inside the package 25. The force sensor die 10 has a rigid force-transferring element 15 and bond pads 61, 64. The rigid force-transferring element 15 of the die 10 is located on the side of the force sensor die 10 facing the opening 39 in the package body part 59. The bond pads 61, 64 are located on the side of the force sensor die 10 opposite to the opening 39.

FIG. 13c further illustrates both the force-transferring element 21 and the cover layer 27, which are connected to the external side of the bottom part 65 of the package body 59. The force-transferring element 21 can have a profiled structure 26, 28 for connection with a button, as shown in FIG. 13c.

The force sensor die 10 is mechanically and electrically connected to the bottom part 65 of the package body 59. Electrical connection can be provided by wire bonding: bond pads 61, 64 of the force sensor die are connected with help of wires 62, 63 to pads 66 located on the bottom part 65 of the package body 59. The force sensor die 10 is mechanically connected to the body 59 of the package 25 by a connection layer 38. Connection material is either an adhesive or other structural material, for example, frit glass. The connection area is located either on the sidewalls of the force sensor die 10 or on the side of the die facing the opening 39 or in both areas. Besides that, the rigid force-transferring element 15 of the die 10 is coupled with the force-transferring element 21 of the package 25. Electronic circuits required for conditioning and processing of the signal of the force sensors can be integrated on the force sensor die 10.

The cavity 71 of the package 25 is filled in with a potting material 75, as shown in FIG. 13b and 13c. The potting material 75 provides mechanical and environmental protection of the wires 62, 63, bond pads 61, 64 located on the force sensor die 10, and bond pads 66 located on the bottom part 65 of the package body 59. At least a portion of the force sensor die 10 can be protected by a gel blob 60 before potting. Potting can cause undesirable stress in the force sensor die 10. Gel allows reduction of the stress induced by the potting.

The external connection elements 70 can be used for both electrical and mechanical connection of the input device 1 to another substrate, board or component used in an electronic system.

Body 59 of the package 25 can be fabricated using different known in the art methods suitable for high-volume production. For example, the package 25 can have a plastic molded body or ceramic body.

The embodiment of the input device 1 presented in FIG. 13 does not contain a separate ASIC die. However, in a version of the sixth embodiment, the input device 1 contains an ASIC die located in the same package 25 as the force sensor die 10. Electrical and mechanical connection of the ASIC die to the package 25 and its electrical connection to the force sensor die 10 can be similar to that described in the previous embodiments.

Seventh Embodiment

FIGS. 14, 15, 16, 17, and 18 show an input device 1 according to the seventh embodiment. A package 25 of the input device 1 shown in FIG. 14 comprises a die-mounting plate 72, body 74, a set of conductive pins 80, and a lid 78. The die-mounting plate 72, the body 74, and the lid 78 define an internal cavity 79. Each pin 80 has a portion 66 located inside the cavity 79, a portion embedded in the package body 74, and an external portion. The die-mounting plate 72 has an opening 73.

A semiconductor force sensor die 10 having rigid force-transferring element 15, and an ASIC die 16 are located in the internal cavity 79 of the package 25. Rigid force-transferring element 15 of the force sensor die 10 is facing the opening 73 in the die-mounting plate 72. Force sensor die 10 has bond pads 41, 44 located on the side facing the lid 78. ASIC die 16 has bond pads 18 on the side facing the lid 78. Force sensor die contains force sensors. Force sensors provide output signal in response to a force applied to the force sensor die 10. ASIC die 16 contains at least a portion of electronic circuit for conditioning and processing of the output signal of the force sensors. At least a portion of the electronic circuit for conditioning and processing of the output signal of the force sensors can be integrated in the force sensor die 10. The force sensor die 10 is mechanically connected to the die-mounting plate 72 with help of a connection layer 76. Connection material can be either an adhesive or other structural material, for example, frit glass or solder. The connection area is located either on the sidewalls of the force sensor die 10 or on the side of the die facing the opening 73 or in both areas. Bond pads 44 of the force sensor die 10 are connected to the portions 66 of the pins 80 with help of wires 42. The ASIC die 16 is mounted on the die-mounting board 72 either with help of an adhesive or by another structural layer. Wire bonding provides electrical connection between the ASIC die 16 and the pins 80. Wires 20 connect ASIC bond pads 18 to the portions 66 of the pins 80 located in the cavity 79. In another version of the embodiment the ASIC die 16 is also electrically connected directly to the force sensor die 10 by wires 40, which connect ASIC bond pads 18 to the bond pads 41 located on the force sensor die 10.

The lid 78 is connected to the body 74 of the package 25 after mounting the force sensor die 10 and ASIC die 16 inside the package 25 and wire bonding. The connection is provided by adhesive, solder, frit glass or other structural material. In a version of the seventh embodiment the mechanical connection between the package body 74 and the lid 78 is achieved by welding or thermo-compression.

The package 25 further comprises a force-transferring element 21 and an optional cover layer 27. Both the force-transferring element 21 and the cover layer 27 are connected to the external surface of the die-mounting plate 72. The force-transferring element 21 is coupled to the rigid force-transferring element 15 of the force sensor die 10 through the opening 73. Both the force-transferring element 21 and the cover layer 27 are formed using a molding process. The force-transferring element 21 has a profiled structure 26, 28 for connection with a button, as shown in FIG. 14c.

Figure 15:
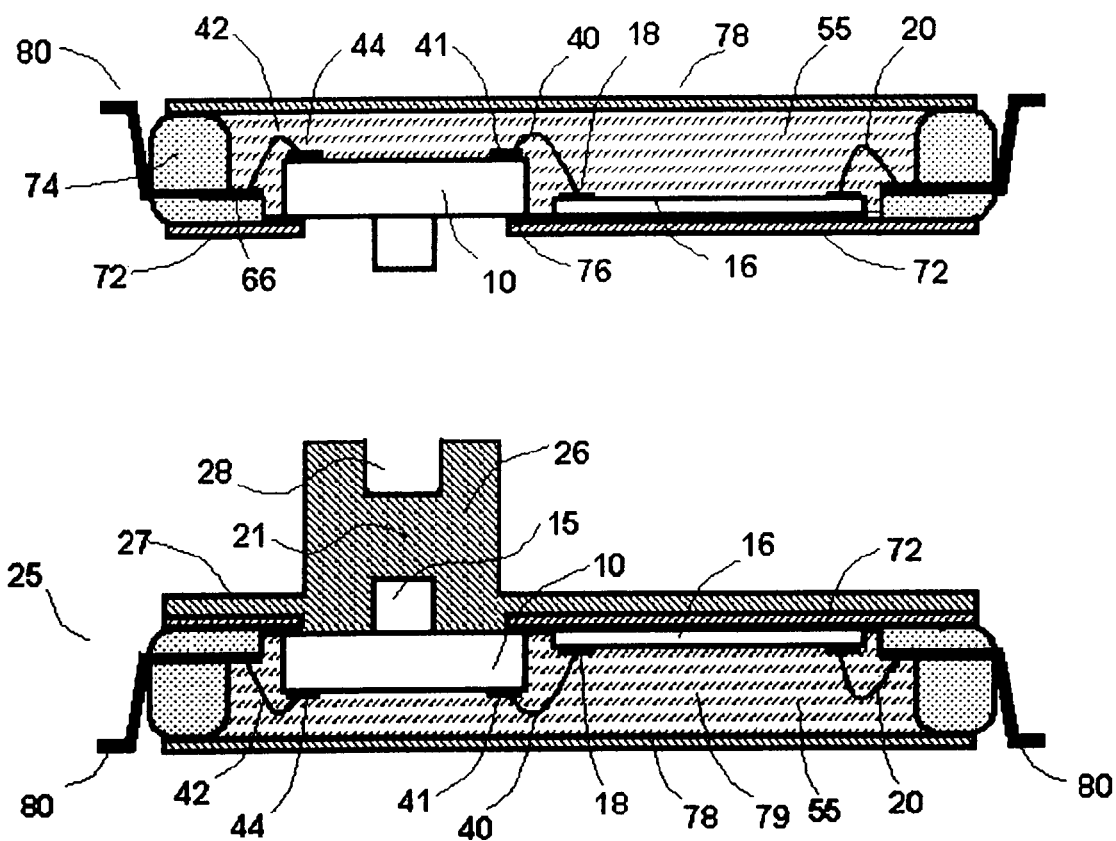
FIG. 15 is a view of a similar to FIG. 14 device with internal cavity between the substrate and the cap filled in with protecting plastic material.
Figure 16:
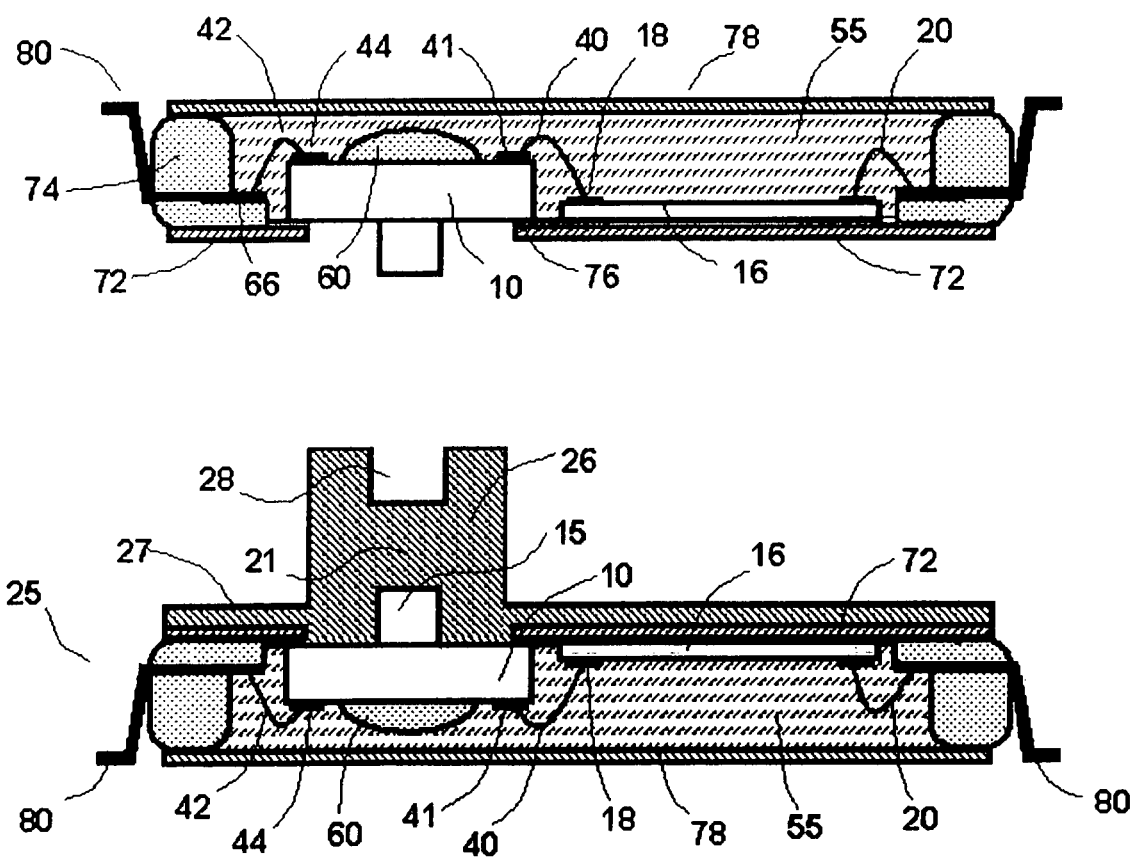
FIG. 16 is a view of a similar to FIG. 15 device with additional gel blob on the surface of the sensor die.
Figure 17:
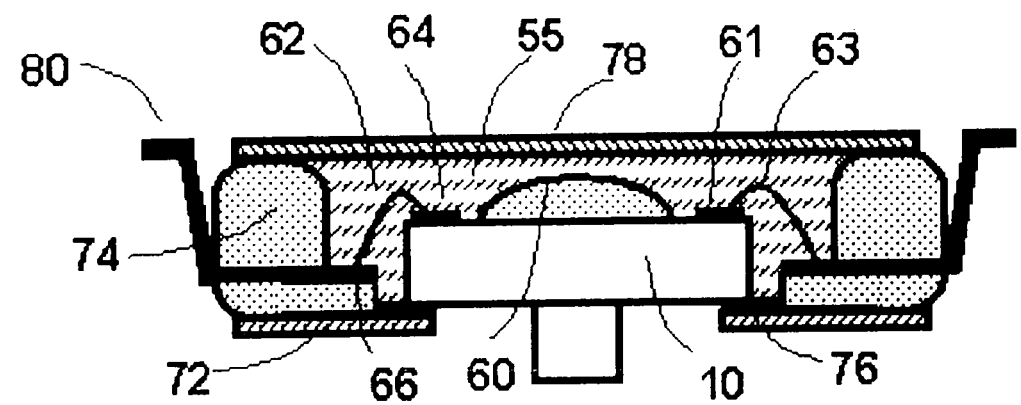
FIG. 17 is a view of a 3D input control device with a wire bonded integrated with ASIC force-sensor die mounted on a metal substrate with a through-hole and internal cavity filled in with protective plastic and having a gel blob on the surface of the die and having an external output leads electrically connected with the die.
Figure 17:
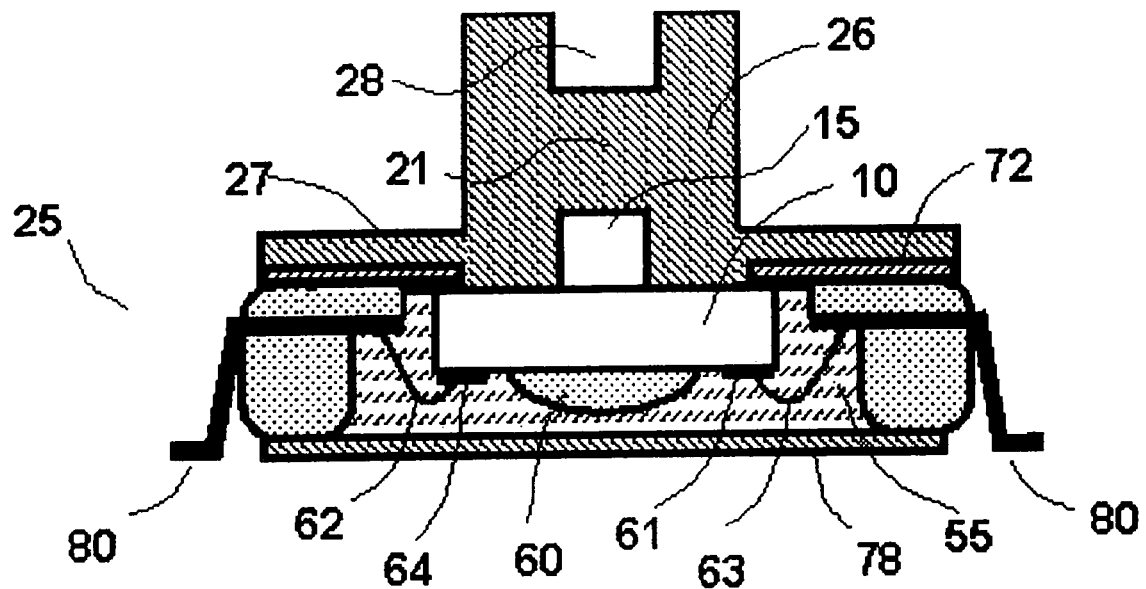

The internal cavity 79 can be filled-in with a material 55 as it shown in FIG. 15. The side of the force sensor die 10 with the bond pads can also be protected by a material other than fill-in material. For example, FIG. 16 shows a force sensor die 10 protected with a blob of gel 60.

Electronic circuits required for conditioning and processing of the signal of the force sensors can be integrated on the force sensor die 10. Since there is available area on the force sensor die 10 integration of signal conditioning and processing electronic circuits does not increase size and cost of the sensor die, while allowing to eliminate the separate ASIC die. As a result, the total size of the input control device and its cost is decreased. The version of the input device with signal conditioning and processing electronic circuits integrated on the sensor die is presented in FIG. 17.

Figure 18:
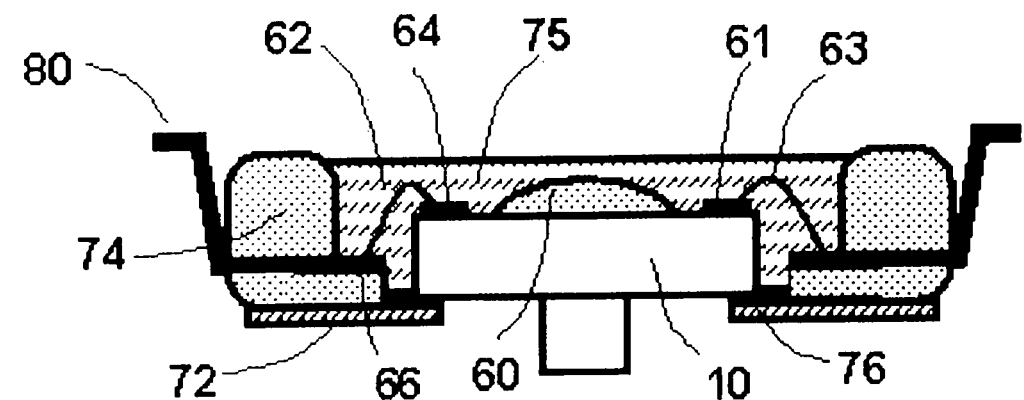
FIG. 18 is a view of a similar to FIG. 17 device without top metal cap and having a potted internal cavity.
Figure 18:
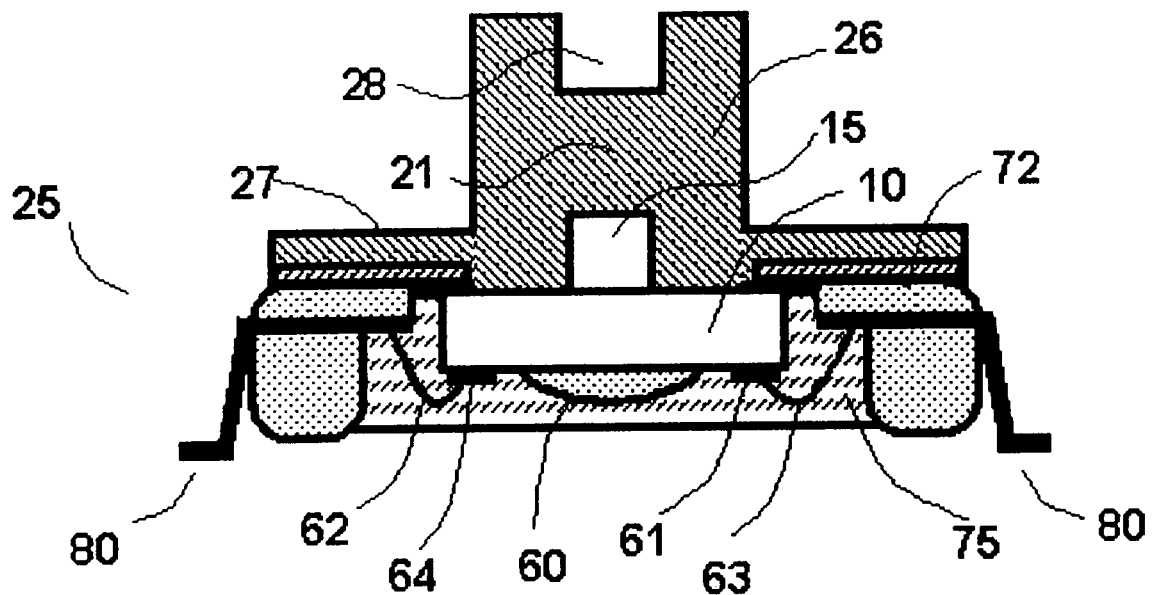

In a version of the input control device 1 according to the seventh embodiment shown in FIG. 18 the internal cavity is potted with a potting material 75. Potting material provides mechanical and environmental protection of the wires 62, 63 and bond pads 61, 64 located on the force sensor die 10. Using potting material 75 allows eliminating the lid, thus reducing the cost.

Eighth Embodiment

Figure 19:
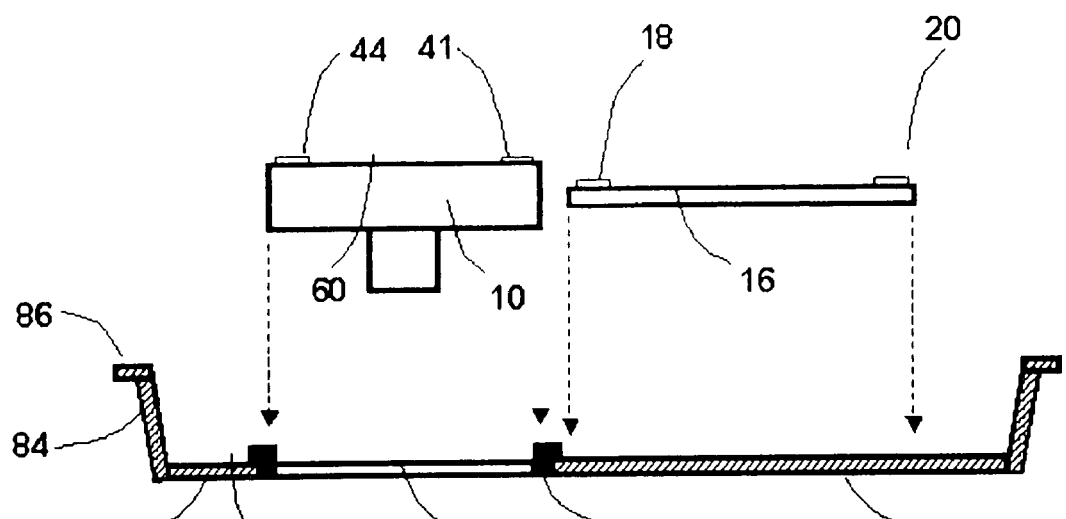
FIG. 19 is a view of a 3D input control device with a wire bonded force-sensor die mounted on a metal frame with a through-hole and an ASIC also mounted on the frame and wire bonded to the external leads and having a gel blob on the surface of the die and all together are molded into a plastic package.
Figure 19:
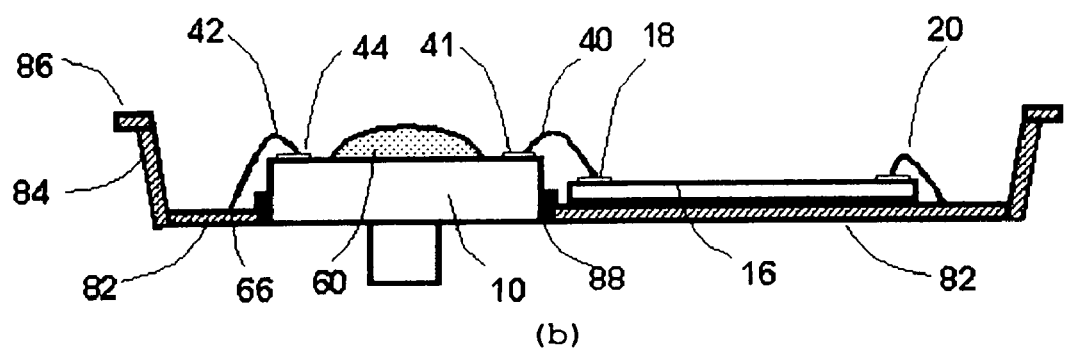
Figure 19:
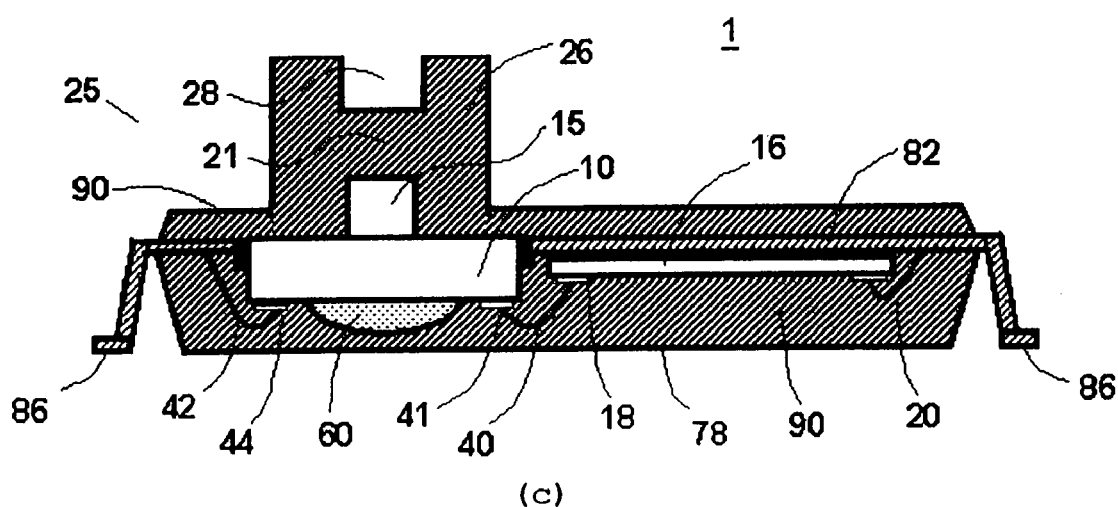
Figure 20:
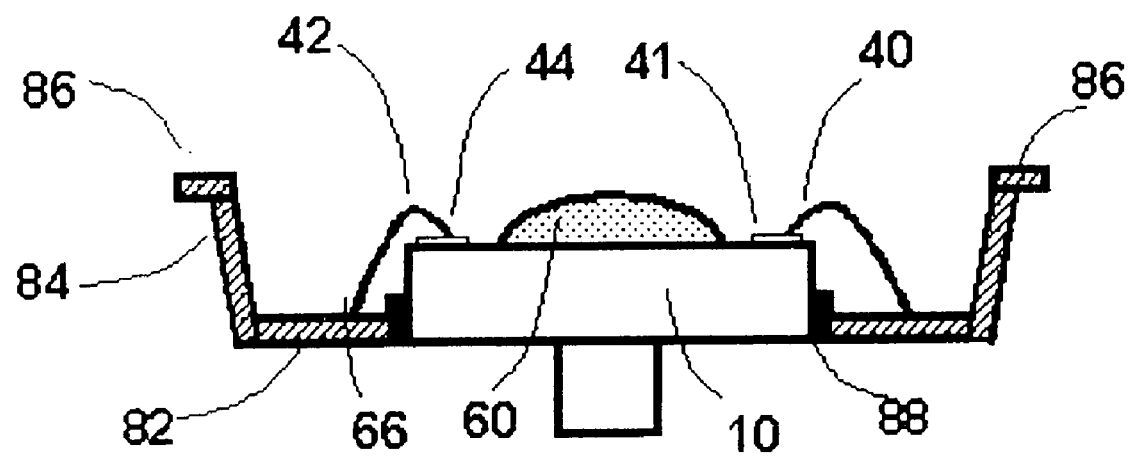
FIG. 20 is a view of a 3D input control device with a wire bonded integrated with ASIC force-sensor die mounted on a metal frame with a through-hole and wire bonded to the external leads and having a gel blob on the surface of the die and all together is molded into a plastic package.
Figure 20:
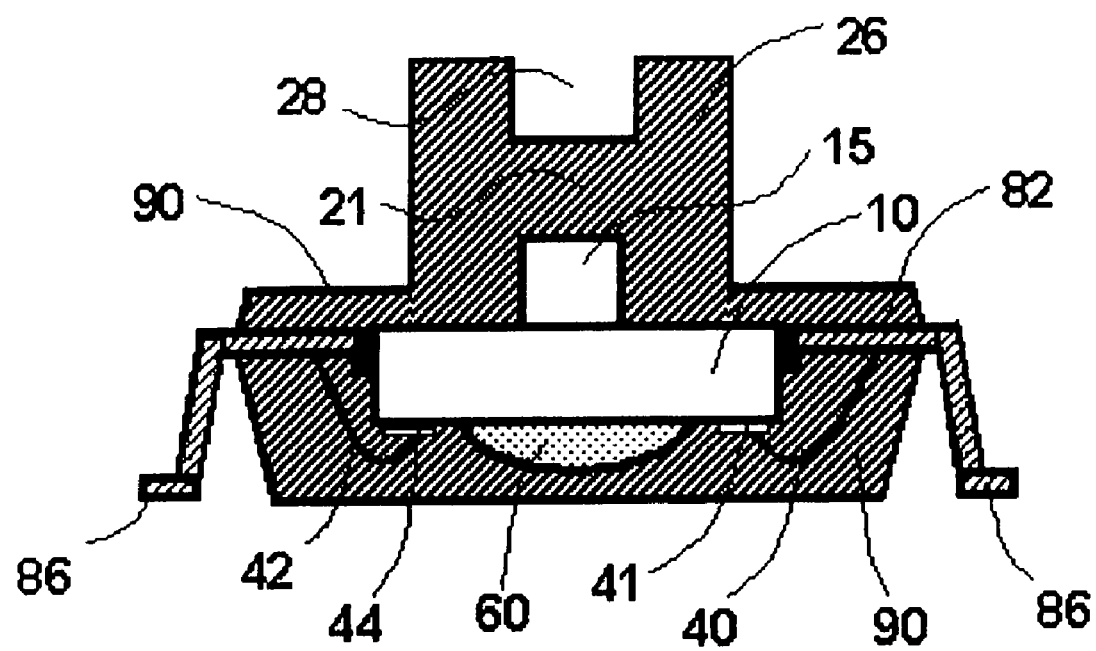

FIGS. 19 and 20 show examples of input device 1 according to the eighth embodiment. A package 25 of the input device 1 shown in FIG. 19 comprises a metal lead frame 82, plastic body 90, and a force-transferring element 21. The plastic body 90 is molded. The metal lead frame 82 provides a mounting surface for the force sensor die 10 and ASIC 16. The mounting surface for the force sensor die 10 has an opening 81. A portion of the metal lead frame 82 is located inside the plastic body 90 and portions 84, 86 of the leads are located outside the plastic body 90. The portions 84, 86 of the leads can be used for both electrical and mechanical connection of the input device 1 to another substrate, board or component used in an electronic system.

A semiconductor force sensor die 10 having rigid force-transferring element 15, and an ASIC die 16 are located inside the plastic body 90 of the package 25. Rigid force-transferring element 15 of the force sensor die 10 is facing the opening 81 in the metal lead frame 82. Force sensor die 10 has bond pads 41, 44 located on the side opposite to the metal lead frame 82. Force sensor die 10 contains force sensors. Force sensors provide output signal in response to a force applied to the force sensor die 10. ASIC die 16 has bond pads 18 on the side opposite to the metal lead frame 82. ASIC die 16 contains at least a portion of electronic circuit for conditioning and processing of the output signal of the force sensors. At least a portion of the electronic circuit for conditioning and processing of the output signal of the force sensors can be integrated in the force sensor die 10. The force sensor die 10 is mechanically connected to the metal lead frame 82 by a connection layer 88. Bond pads 44 of the force sensor die 10 are connected to the leads of the metal lead frame 82 by wires 42. The ASIC die 16 is mounted on the metal frame 82. Electrical connection between the ASIC die 16 and the metal frame 82 is provided by wire bonding. Wires 20 connect ASIC bond pads 18 to the portions metal frame 82. In a version of the embodiment the ASIC die 16 is also electrically connected directly to the force sensor die 10 by wires 40, which connect ASIC bond pads 18 to the bond pads 41 located on the force sensor die 10.

Plastic molding is done after mounting the force sensor die 10 and ASIC die 16 on the metal lead frame 82 and wire bonding are complete. A plastic body 90 provides both mechanical and environmental protection of the force sensor die 10, the ASIC die 16 and all interconnects.

In a version of the eighth embodiment the force-transferring element 21 can be molded together with the plastic body 90 of the package 25. In another version of this embodiment the force-transferring element 21 can be formed at another step. The force-transferring element 21 is coupled to the rigid force-transferring element 15 of the force sensor die 10 through the opening 81. The force-transferring element 21 has a profiled structure 26, 28 for connection with a button, as shown in FIGS. 19 and 20.

The force sensor die 10 can be additionally protected with an elastic material, such as a blob of gel 60, as shown in FIG. 19 and 20.

Electronic circuits required for conditioning and processing of the signal of the force sensors can be integrated on the force sensor die 10. This allows eliminating the ASIC die. This version of the input device 1 according to the eighth embodiment presented in FIG. 20.

Ninth Embodiment

Figure 21:
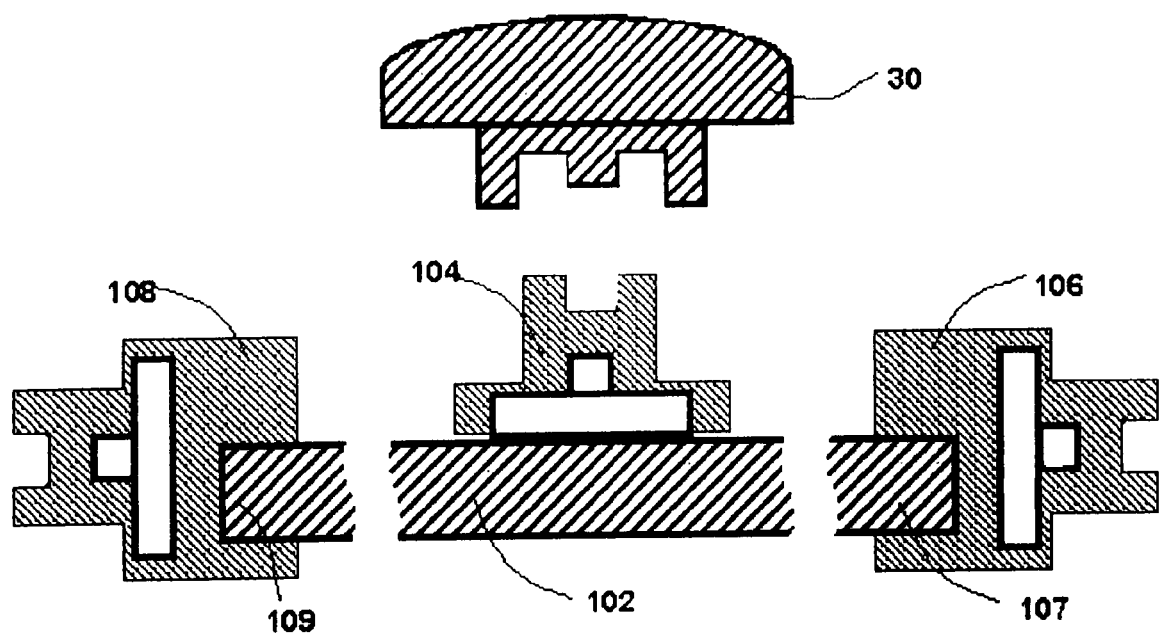
FIG. 21 is a view of front-mounted and edge-mounted 3D input control devices on a PCB.

FIG. 21 shows three orientations for mounting the input control device on a PC board 102 according to an embodiment of the invention. Input device 104 is mounted on the front side of the PC board 102. Input device 106 is mounted on the right edge 107 of the PC board 102 and input device 108 is mounted on the left side 109 of the PC board 102. Electrical connections to the input devices can be provided either on the front side or on the backside of the PC board 102. Direct edge-mounting on the PCB requires a specialized package in order to provide both reliable mechanical and electrical connection of the input device 106, 108 to the PC board 102. Button 30 can be coupled with the input device independently on the type of mounting. However, it can be appreciated that the design of the button 30 is adjusted for each type of input device mounting 104, 106, and 108 in order to provide maximum convenience for a user.

Figure 22:
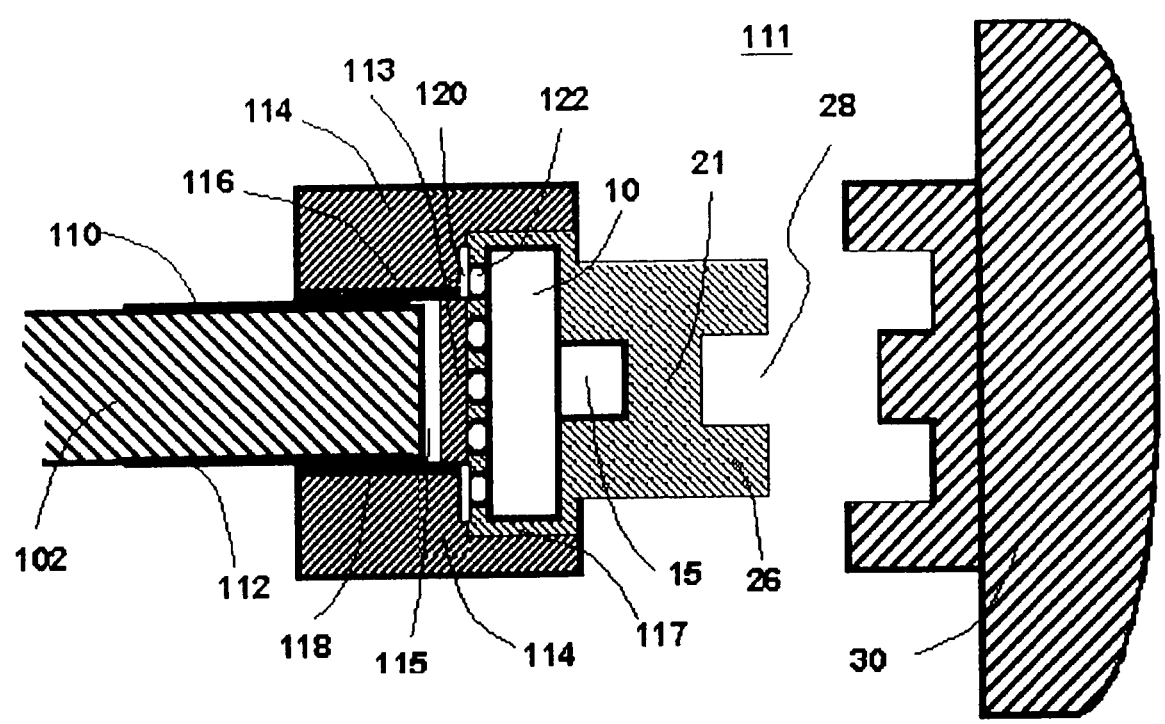
FIG. 22 is a view of edge-mounted 3D input control devices on a PCB with the package having a groove for mechanical coupling with PCB and with an external button attaching to a force-transferring element of the package.
Figure 23:
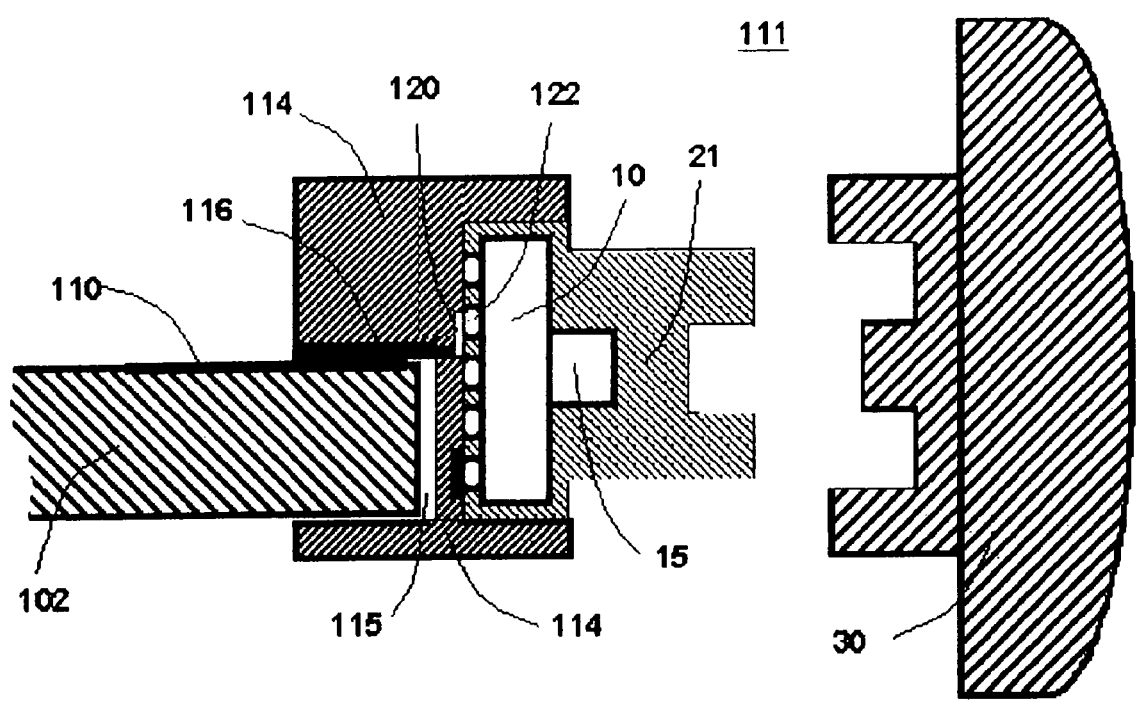
FIG. 23 is a view of a similar to FIG. 22 device with asymmetric location of the groove on the package for preferred asymmetric position of 3D input control device with respect to a PCB.
Figure 24:
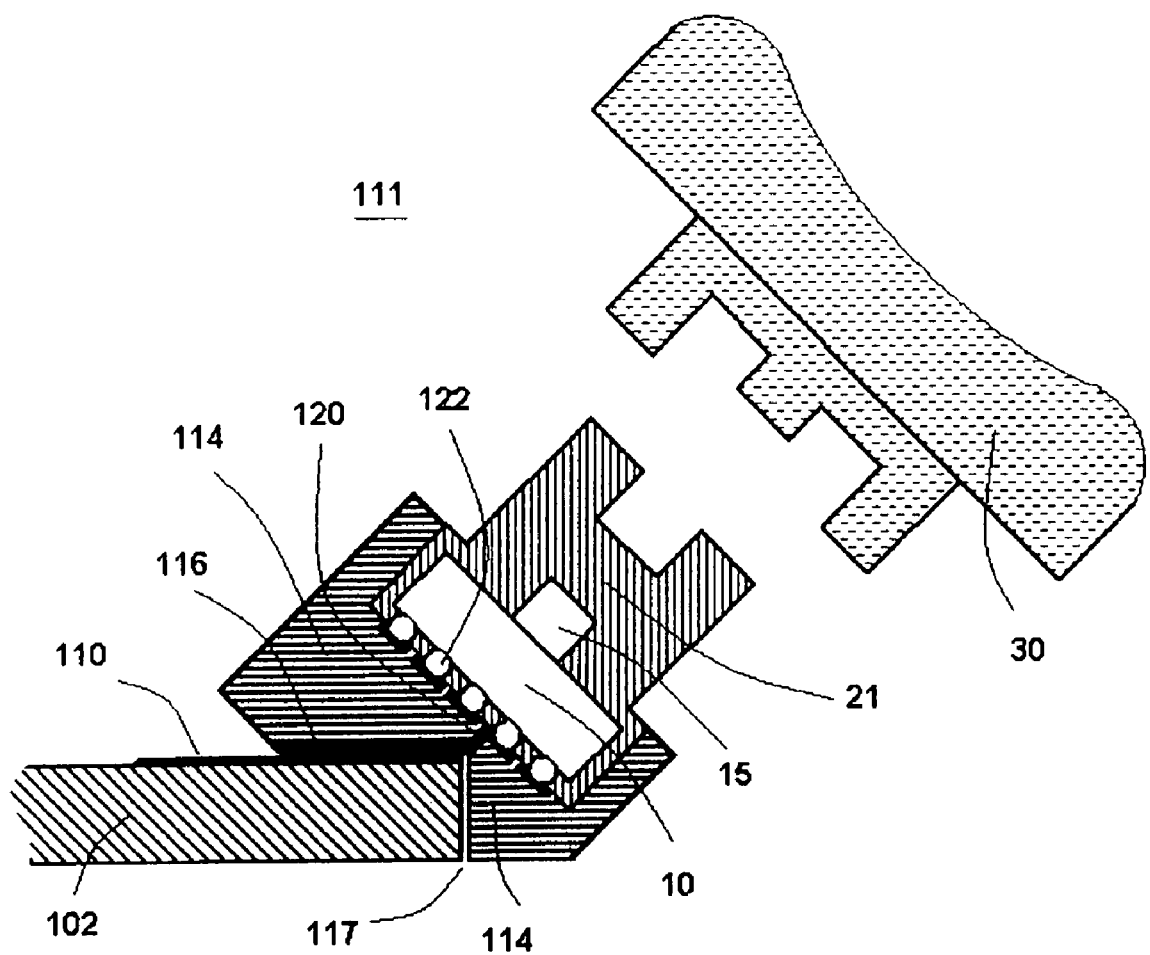
FIG. 24 is a view of edge-mounted 3D input control devices on a PCB with the profiled package for mechanical coupling with PCB from one side.

FIGS. 22, 23, and 24 show versions of the input device 1 suitable for edge mounting on PC boards according to the ninth embodiment. The package of input device 111 shown in FIGS. 22-24 comprises a body 114 and a force-transferring element 21 and a button 30. The body 114 of the input device shown in FIG. 22 has a die mounting plate 113 with conductive portions 120, slot 115, cavity 117, and a set of conductors 116, 118. Conductors 116, 118 are connected to the conductive portions 120 of the die mounting plate 113. Conductors 116, 118 are opened inside the slot 115. A force sensor die 10 is located inside the cavity 117. The force sensor die 10 has a rigid force-transferring element 15 and connection elements 122. The force sensor die 10 is mounted on the die mounting plate 113 and the connection elements 122 are connected to the conductive potions 120 of the die mounting plate 113. The force-transferring element 21 of the package is coupled with the rigid force-transferring element 15 of the force sensor die 10. The force-transferring element 21 of the package has a profiled structure 26, 28 for connection with a button 30.

The package 111 is mounted on the edge of a PC board 102. Electrical connectors 110 and 112 are located on the opposite sides of the PC board. The edge PC board is inserted inside the slot 115. Mechanical connection between the package 111 and the PC board 102 is provided within the slot 115. Electrical connections between the package 111 and the PC board 102 are provided between the conductors 116, 118 of the package 111 and the electrical connectors 110 and 112 of the PC board 102.

Different versions of the package 111 are presented in FIGS. 22, 23 and 24. Package 111 of the input device 1 shown in FIG. 22 has slot 115 located in the central part of the body 114. Package 111 of the input device 1 shown in FIG. 23 has slot 115 located asymmetrically. As a result, most of the package size is located predominantly on one side of the PC board. Package 111 of the input device 1 shown in FIG. 24 has step 117 instead of a slot, which can be considered, as a slot shifted to the edge of the body 114. If required by application, this solution provides completely flat one of the surfaces of PC board.

Tenth Embodiment

Input devices described in the previous embodiments can have different versions of the force-transferring element 21. Some versions of the force-transferring element 21 are described in this embodiment.

Figure 25:
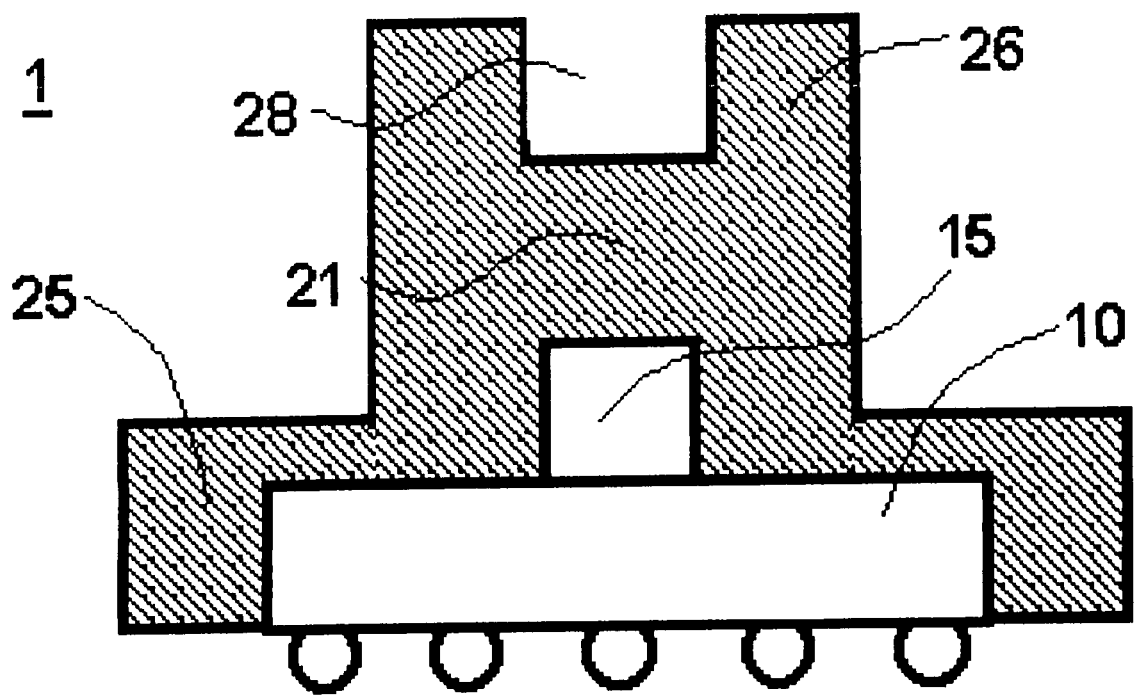
FIG. 25 is a view of a 3D input control device with a package molded from one-layer plastic material.

FIG. 25 shows a version of an input device according to the tenth embodiment. The input device 1 contains a package 25 having a force-transferring element 21 and a semiconductor force sensor die 10 with a rigid force-transferring element 15. The force-transferring element 21 is mechanically coupled to the rigid force-transferring element 15 of the force sensor die 10. The force-transferring element 21 of the package 25 is made from one layer of a plastic material. The layer of plastic material can be a uniform layer, as it is shown in FIG. 25. Alternatively, the layer of plastic material can have properties changing from the outer part, which can be either in contact with human finger, other source of force or with a button, to the inner layer, which is in contact with the rigid force-transferring element 15 of the force sensor die 10.

Figure 26:
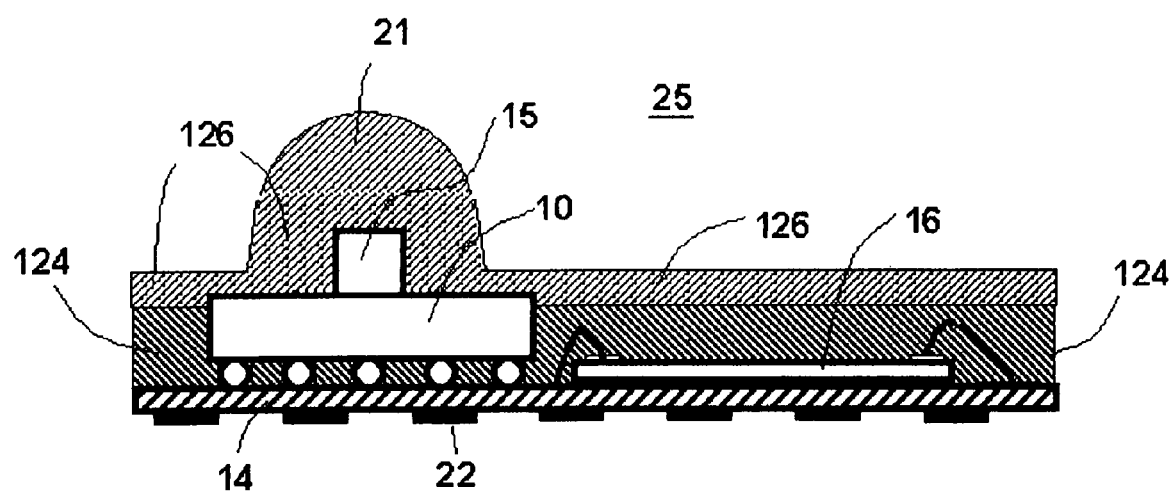
FIG. 26 is a view of a 3D input control device with a package molded from two-layer plastic materials.

FIG. 26 shows another input device 1 according to the tenth embodiment. The input device 1 contains a package 25 with a substrate 14. A semiconductor force sensor die 10 having rigid force-transferring element 15 and an ASIC die 16 are located inside the package 25. The package 25 has a force-transferring element 21, which is mechanically coupled to rigid force-transferring 15 element of the force sensor die 10. The force sensor die 10 is flip-chip mounted on the substrate 14. The substrate 14 has connection elements 22 for both electrical and mechanical connection to another substrate, board or component used in an electronic system. Input device 1 shown in FIG. 26 has a set of connection elements 22 forming a ball-grid array (BGA). The package 25 is formed from two layers of plastic 124 and 126. The bottom layer 124 is contacting the substrate 14, completely encloses ASIC die 16 and can contain a portion of the sensor die 10. A top plastic layer 126 covers at least a portion of the bottom layer 124 and contains a force-transferring element 21, which provides coupling with the rigid force-transferring element 15 of the force sensor die 10. The layers 124 and 126 of plastic materials have different properties. For example, the bottom layer 124 can be a harder material than the top layer 126. Package 25 of input device 1 according to the tenth embodiment can utilize more than two layers of plastic material. For example, the force-transferring element 21 of the package 25 can be made from several layers of plastic materials.

Figure 27:
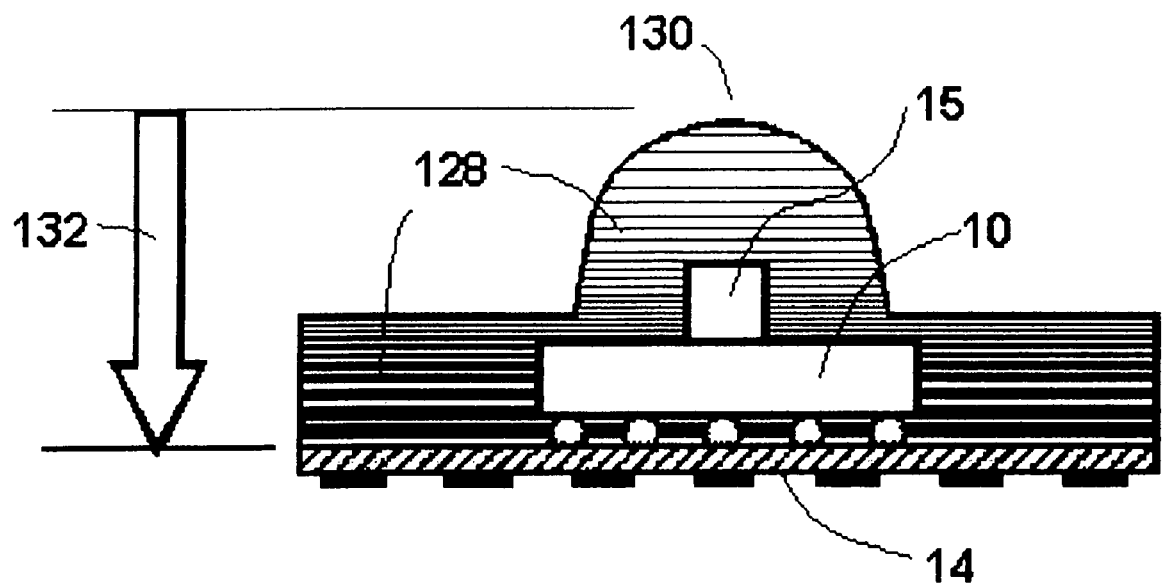
FIG. 27 is a view of a 3D input control device with a package molded from plastic material having a gradient of hardness.

FIG. 27 shows still another version of an input device according to the tenth embodiment. The input device 1 contains a package 25 having a force-transferring element 21, substrate 14 and a semiconductor force sensor die 10 with a rigid force-transferring element 15. The force sensor die is flip-chip mounted on the substrate 14. The force-transferring element 21 is mechanically coupled to the rigid force-transferring element 15 of the force sensor die 10. The force-transferring element 21 of the package 25 is made from a plastic material 128 with a gradient 132 of mechanical, thermal and other physical properties. The inner layer of plastic material contacting the substrate 14 can be more rigid in comparison with the outer layer 130. The inner layer can be harder and provide strength to the package 25 while the outer layer can be softer than the inner layer providing a required interface with a source of external force. Required modification of properties of the plastic material, as for example hardness, can be achieved by different ways known in the art, including change of material composition, chemical or physical modification of properties of the outer layer, for example by thermal or radiation treatment.

Although discussed in regard to the input device 1 described above, similar approach can be applied to other designs of the input device described in the other embodiments of the present invention.

Eleventh Embodiment

As the input devices described in this invention should work in electronic systems under the continuously changing mechanical force, it requires their reliable mechanical coupling. Several options providing mechanically strong reliable coupling of input devices in electronic systems are described in the eleventh embodiment, as illustrated in FIGS. 28, 29, and 30.

Figure 28:
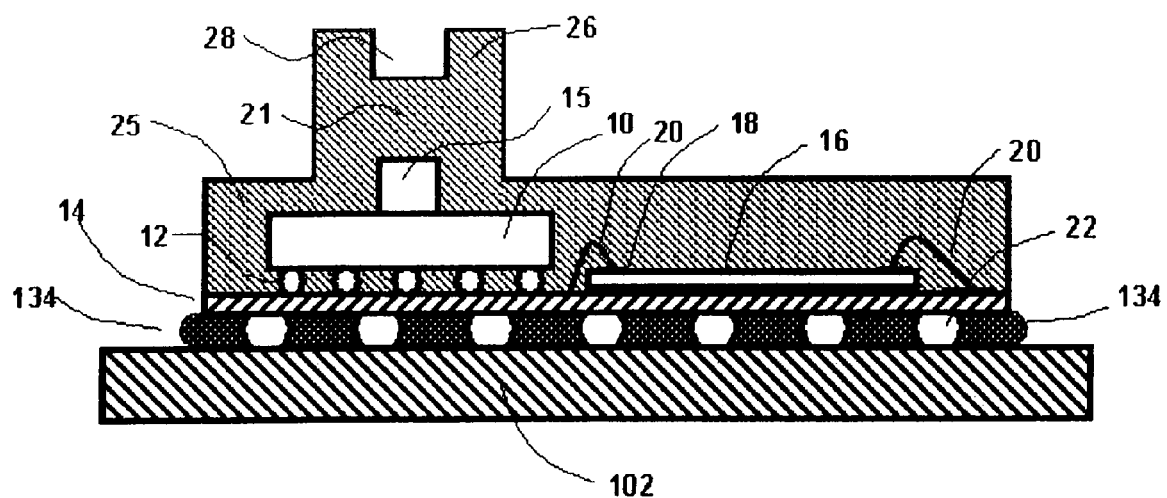
FIG. 28 is a view of a 3D input control device mounted on a printed circuit board (PCB) and with underfill material between the package and PCB.

FIG. 28 shows an example of an input device 1 according to the eleventh embodiment. The input device 1 contains a package 25, and a substrate 14. An ASIC die 16 and a semiconductor force sensor die 10 having a rigid force-transferring element 15 are located inside the package 25. The package 25 has a force-transferring element 21 coupled with the rigid force-transferring element 15 of the force sensor die 10. The force sensor die 10 is flip-chip mounted on the substrate 14 with help of connection elements 12, which provide both electrical and mechanical connection of the force sensor die 10 to the substrate 14. The ASIC die 16 is also mechanically and electrically connected to the substrate 14. The input device 1 is mounted on a board 102 of an electronic system. Both mechanical and electrical connection of the input device 1 to the board 102 is achieved by connecting of the connection elements 22 (solder balls are shown in FIG. 28) to the board 102. An underfill layer 134 is used between the substrate 14 and the board 102 providing stronger mechanical connection and protection of electrical connections between the input device 1 and the board 102 from the environment.

When input device 1 does not use a substrate, as shown in FIGS. 1 and 2, then an underfill material is used between the force sensor die 10 and a printed circuit board where this die as part of the input control device is mounted. In this case the underfill material plays also a second role, as a protection against a mechanical shock, or as a mechanical damper. The underfill material in this case is elastic and does not affect the spring constant of the silicon suspension of the force sensor die 10.

Figure 29:
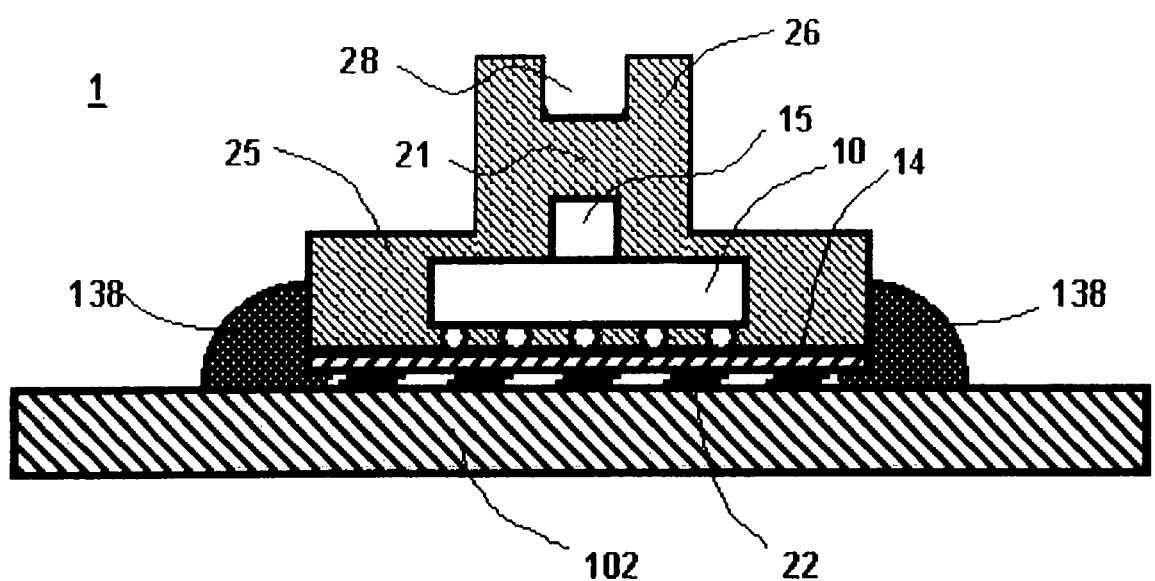
FIG. 29 is a view of a 3D input control device mounted on a printed circuit board (PCB) and additionally attached to PCB with adhesive material from the edges of the package.
Figure 30:
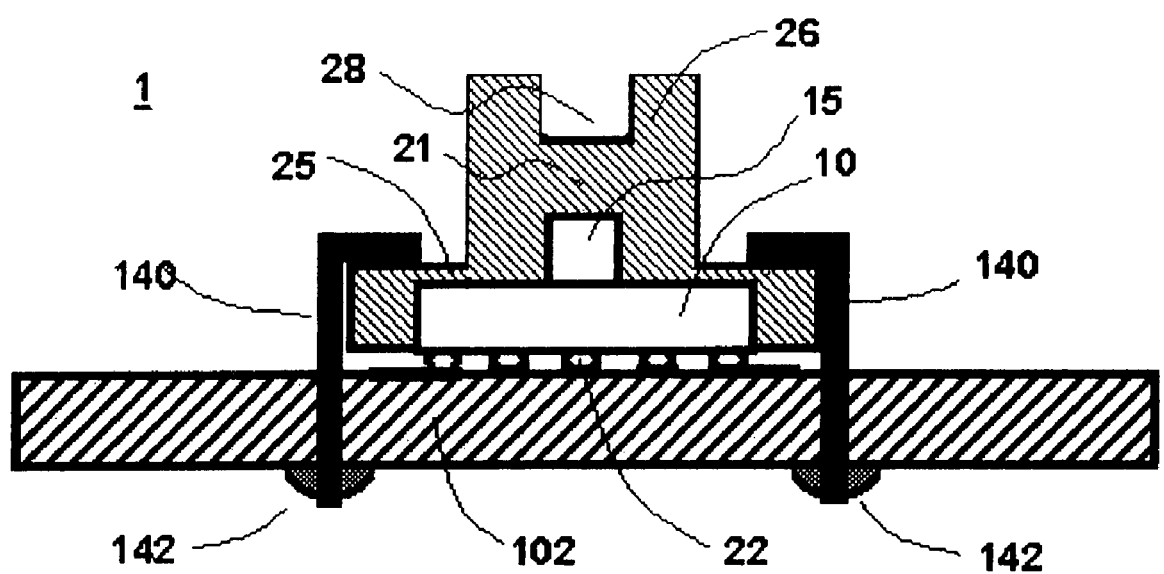
FIG. 30 is a view of a 3D input control device mounted on a printed circuit board (PCB) and additionally attached to PCB with a bracket soldered to PCB.

FIG. 29 shows an example of an input device 1 according to the eleventh embodiment. The input device 1 contains a package 25, and a substrate 14. A semiconductor force sensor die 10 having rigid force-transferring element 15 is located inside the package 25. The package 25 has a force-transferring element 21 mechanically coupled to rigid force-transferring element 15 of the die 10. The force sensor die 10 is flip-chip mounted on the substrate 14. The substrate 14 has connection elements 22 for both electrical and mechanical connection to another substrate or board. The connection elements 22 can be solder balls, solder bumps or pads covered with under-bump metallization suitable for flip-chip mounting. Input device 1 shown in FIG. 29 has a set of connection elements 22 forming LGA. The input device 1 is mounted on a board 102. Both mechanical and electrical connection of the input device 1 to the board 102 is achieved by connecting of the LGA pads 22 to the board 102. An adhesive layer 138 can be used both between the substrate 14 of the input device 1 and the board 102 and along the side walls of the package 25 in order to provide better mechanical connection and protect electrical connections between the input device 1 and the board 102 from the environment.

FIG. 30 shows an example of an input device 1 according to the eleventh embodiment. The input device 1 contains a package 25 having a force-transferring element 21 and a semiconductor force sensor die 10 with a rigid force-transferring element 15. The force-transferring element 21 is mechanically coupled to the rigid force-transferring element 15 of the force sensor die 10. Input device 1 shown in FIG. 30 has a set of connection elements 22. The input device 1 is mounted on a board 102. Both mechanical and electrical connection of the input device 1 to the board 102 is achieved by connecting of the connection elements 22 to the board 102. At least one bracket 140 is used to secure the package 25 to the board 102 providing stronger mechanical connection between the input device 1 and the board 102. In one version of this embodiment the bracket 140 is soldered to the board 102 with material 142, as shown in FIG. 30.

It should be clear that the same approaches can be used for mounting of the input devices described in other embodiments of this invention.

Twelfth Embodiment

Figure 31:
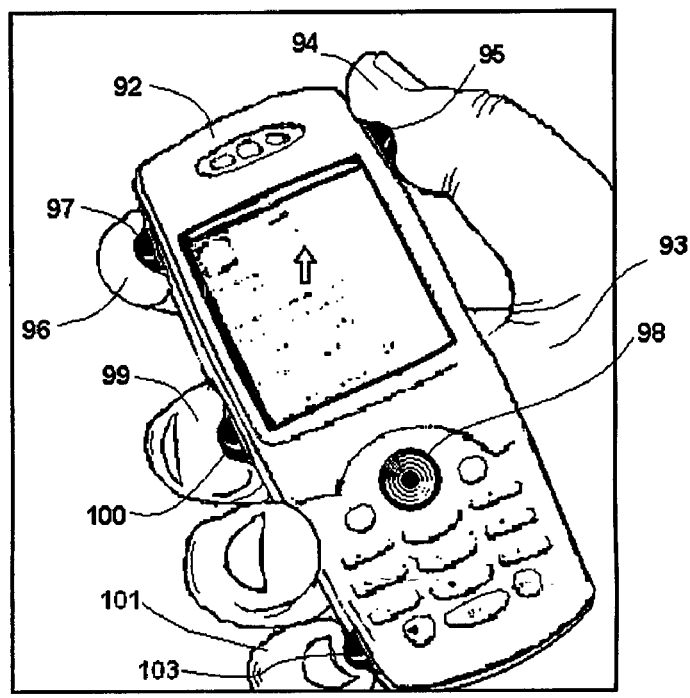
FIG. 31a is a view of a cell phone with different locations of 3D input control devices on the body of the cell phone.
FIG. 31b is a view of a gaming device with different locations of 3D input control devices on the body of the gaming device.
Figure 31:
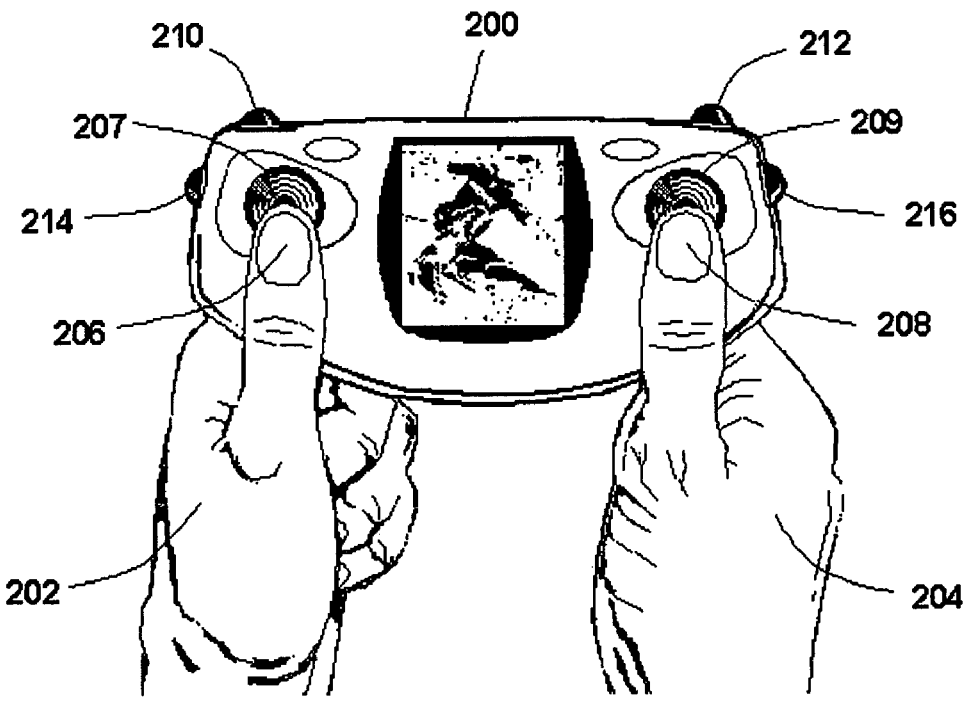

A large advantage of the input device according to this invention is its very small size. This allows allocating minimal space in practically any place on the surface of a handheld device. For example, the input device can be placed not only on the front panel of a handheld device, as in many cases, but it also can be placed on a side of a handheld device, as it is shown in FIG. 31. There is a need to have at least two basic options of an edge-mounted input control device: on the right side of a handheld device—for right-handed people—and on the left side of a handheld device—for left-handed people. Both these options are shown in FIG. 31.

FIG. 31a shows a cell phone 92, as an example of a handheld device that can benefit from the use of force-controlled 2D or 3D input control devices described in the present invention. Finger-controlled micro-mouse or micro-joystick 98 is shown on the front panel of the cell phone 92. Similar force-controlled micro-mouse or micro-joystick is installed on the side of cell phone as well. In particular, micro-mouse or micro-joystick 97 and 95 are installed on the top portion of the cell phone 92 from the left-hand side and right-hand side correspondingly. Micro-mouse or micro-joystick can be installed on other parts of the sidewalls of the cell phone 92 where micro-mouse or micro-joystick device 100 and 103 can be controlled by the fingers 99, 101 correspondingly, as shown in FIG. 31a.

FIG. 31b shows a gaming device 200 as another example of a hand-held device that can benefit from the use of force-controlled 2D or 3D input control devices described in the present invention. In particular, at least one force sensor is installed on the front panel of gaming device 200. Two finger-controlled micro-joystick devices 207, 209 are shown on the front panel of the gaming device 200. Similar force-controlled micro-joysticks are installed on a sidewall of gaming device 200 as well. FIG. 31b shows micro-joysticks 210, 212 installed on the top portion of the sidewall of the gaming device 200. Micro-joysticks 214, 216 are installed on the left and right side walls of the gaming device 200, correspondingly. Micro-joystick control devices can be installed on other parts of the front panel, back panel and sidewalls of the gaming device 200.

As described in the first embodiment, the buttons are designed ergonomically to provide the maximum convenience for the user providing preferable material, shape, size, range of the force required to operate the input device, stiffness, maximum deformation, feeling in touch, and color.

A hand-held device, for example, a cell phone or a gaming device can have multiple micro-mouse or micro-joystick devices or multiple groups of these devices.

A hand-held device can have multiple sockets for finger-controlled micro-joystick devices and these devices can be mounted and re-mounted in the different sockets.

Furthermore, micro-mouse and micro-joystick devices can have programmable functionality and selectable sensitivity. For example, in a gaming device having two 3D micro-joysticks allows controlling six independent parameters.

The described finger-controlled micro-mouse and micro-joystick devices provide capabilities of moving an object on the screen of cell phone, gaming device or other hand-held device in any direction with a speed of motion proportional to the applied force. Being sensitive to the Z-force, they serve also as action buttons. These advantages of finger-controlled micro-mouse or micro-joystick devices provide superior functionality compared to a 4-way button. Furthermore, above described options of placement and flexibility in assigning and programming functionality of the micro-mouse or micro-joystick control devices bring additional value to the electronic systems utilizing these types of control devices.

It should be understood that the microstructures of the die, structures of the packages, buttons, methods of their mounting and materials used do not limit the present invention, but only illustrate some of the various technical solutions covered by this invention. While the invention has been described in detail with reference to preferred embodiments, it is understood that variations and modifications thereof may be made without departing from the true spirit and scope of the invention.

What is claimed is:

1. Semiconductor input control device for inputting mechanical signals into an electronic system comprising:
   a force sensor die formed within semiconductor substrate and containing:
      a force sensor providing electrical output signal in response to applied external force, connection elements for electrical and mechanical connection within an electronic system;
   a package:
      enclosing a part of the force sensor die and comprising a force-transferring element, which is coupled to the sensor die and transfers an external force to the force sensor die;
   wherein connection elements of the force sensor die are exposed for direct mounting of the semiconductor input control device within an electronic system.

2. A device of claim 1, wherein an external force is applied directly to the force-transferring element of the package.

3. A device of claim 1, wherein the force sensor die has a rigid force-transferring element coupled to the force-transferring element of the package for better and multi-axis sensitivity of the device.

4. A device of claim 1, wherein the force-transferring element coupled to the sensor die is made from plastic materials chosen from the group of: one layer uniform material, at least two layers of uniform materials, non-uniform plastic material with gradient of hardness or combination of the above.

5. Semiconductor input control device for inputting mechanical signals into an electronic system comprising:
  a force sensor die formed within semiconductor substrate and containing:
    a force sensor providing electrical output signal in response to applied external force, connection elements for flip chip mounting;
  a package comprising:
    a substrate;
    and a force-transferring element, which is coupled to the sensor die and transfers an external force to the force sensor die;
  wherein the force sensor die is flip-chip mounted on the substrate.

6. A device of claim 5, wherein an external force is applied directly to the force-transferring element of the package.

7. A device of claim 5 further comprising at least one signal conditioning and processing integrated circuit die providing conditioning and processing of the output signals from the force sensor, wherein the force sensor die and at least one signal conditioning and processing integrated circuit die are mounted on the substrate 8. A device of claim 5, wherein the force sensor die is flip-chip mounted on the additional integrated circuit die.

9. A device of claim 5, wherein the force sensor die has a rigid force-transferring element coupled to the force-transferring element of the package for better and multi-axis sensitivity of the device.

10. A device of claim 5, wherein the force-transferring element coupled to the sensor die is made from plastic materials chosen from the group of: one layer uniform material, at least two layers of uniform materials, non-uniform plastic material with gradient of hardness or combination of the above.

11. Semiconductor input control device for inputting mechanical signals into an electronic system comprising:
  a force sensor die formed within semiconductor substrate and having:
    a planar side with at least two contact pads;
    a force applying die side, which is opposite to planar side; and
    a force sensor providing electrical output signal in response to applied external force,
  a package:
    containing the force sensor die and comprising:
      a die-mounting element having an opening;
      a force-transferring element, which is coupled to the sensor die and transfers an external force to the force sensor die; and
      at least two output leads for electrical connection to contact pads of the sensor die;
  wherein the force sensor die is attached to the die mounting element such that:
    the force applying die side is facing the opening;
    the planar side of the die is facing away from the opening and away from the force-transferring element;
    the force-transferring element of the package is coupled to the force sensor die through the opening.

12. A device of claim 11, wherein an external force is applied directly to the force-transferring element.

13. A device of claim 11 further comprising at least one signal conditioning and processing integrated circuit die providing conditioning and processing of the output signals from the force sensor, wherein the force sensor die and at least one signal conditioning and processing integrated circuit die are mounted on the substrate.

14. A device of claim 11, wherein electrical connection to the contact pads on the planar side of the force-sensor die are made via wire bonding.

15. A device of claim 11, wherein the package further comprises a cap, and said cap is positioned within the package in such a way that the planar side of the force-sensor die is facing this cap.

16. A device of claim 15, wherein the output leads of the package are located on the cap.

17. A device of claim 11, wherein the force sensor die and the surface of the die-mounting element are at least partially covered with plastic material chosen from the group of: molding materials, potting materials, gels, rubber-like materials and combination of the above.

18. A device of claim 11, wherein the package has a cavity and the die-mounting element is located within the cavity.

19. A device of claim 11, wherein die-mounting element is made from the material chosen from the group of: plastic, metal, ceramic, glass, semiconductor and combination of the above.

20. Semiconductor input control device for inputting mechanical signals into a digital system comprising:
  a force sensor die formed within semiconductor substrate and having:
    a planar side;
    a force applying die side, which is opposite to the planar side; and
    a force sensor providing electrical output signal in response to applied external force, and connection elements for flip chip mounting;
  a package:
    containing a force sensor die and comprising:
      a package body having an external mounting surface not parallel to the planar side of the force sensor die;
      a die-mounting element;
      a force-transferring element, which is coupled to the force sensor die and transfers an external force to the force sensor die; and
      at least two output leads located on the external mounting surface;
  wherein said semiconductor input control device is mounted on PCB such that the planar side of the force sensor die is not parallel to the PCB and the external mounting surface is facing the PCB.

21. A device of claim 20, wherein an external force is applied directly to the force-transferring element.

22. A device of claim 20, wherein the package has a groove and the external mounting surface is located on at least one side wall of the groove.

23. A semiconductor input control device of claim 20, wherein the device is mounted on an edge of the PCB such that the planar side of the force sensor die is perpendicular to the PCB.

24. Semiconductor input control device for inputting mechanical signals into a digital system comprising:
  at least one die providing functions of force sensing, signal conditioning and signal processing;
  a package containing a die providing at least a function of force sensing and comprising a force-transferring element, which is coupled to the force sensing die and transfers an external force to the force sensing die;
  wherein a partitioning between force sensing, signal conditioning and signal processing functions is chosen from the group consisting of: integration of force sensing, signal conditioning and signal processing functions within one force sensing die; integration of force sensing and at least some signal conditioning within one die and at least signal processing within the other die; integration of force sensing within one die and signal conditioning within the other die; integration of force sensing within one die and signal conditioning and signal processing within at least one other die.

25. Semiconductor input control device for inputting mechanical signals into a digital system comprising:
a force sensor die formed within semiconductor substrate and providing electrical output signal in response to applied external force;
a package containing a force sensor die and comprising a force-transferring element, which is coupled to the sensor die and transfers an external force to the force sensor die;
a button mechanically coupled to the force-transferring element of the package,
wherein the button provides an interface with the external force and transfers it to the force-transferring element, which transfers force to the force sensor die.

26. A device of claim 25, wherein the force-transferring element and the button are coupled across a surface having at least one additional element with a shape chosen from the group consisting of: hole, cavity, trench, notch, pole, pin, rim, step, bar, thread, tooth, hook, locking mechanism or combination of the above.

27. A device of claim 25, wherein the button has a connector to the force-transferring element, said connector allows replacing or interchanging the buttons.

28. A device of claim 25, wherein the button has a profiled connector to the force-transferring element, said connector has at its surface at least one additional mechanical element protecting the semiconductor input control device from mechanical force and torque overload.

29. A device of claim 25, wherein the button is integrated in a control panel chosen from the group consisting of: keyboard, key-mat, control surface area or combination of the above.

30. A device of claim 25, wherein the button is made from the material chosen from the group consisting of: plastic, metal, ceramic, glass, polymer, gem or combination of the above.

31. A device of claim 25, wherein the button has a color chosen from the group consisting of: red, orange, yellow, green, blue, magenta, violet, black or combination of the above.

32. A device of claim 25, wherein the button has shape elements chosen from the group consisting of: convex, concave, saddle, cylinder, disk, dome, stick, hemisphere, cone, pyramid, prism, tore, dimple, notch, tactile recognizable feature, or combination.

33. Semiconductor input control device for inputting mechanical signals into a digital system comprising:
a force sensor die formed within semiconductor substrate and providing electrical output signal in response to applied external force;
a package containing a force sensor die and comprising a force-transferring element, which is coupled to the sensor die and transfers an external force to the force sensor die;
wherein the package is mounted on a PCB and mechanical coupling to the PCB is chosen from the group of: soldering, underfill adhesive, adhesive applied around the sidewalls of the package and PCB surface, metal bracket or combination of the above.

34. A device of claim 33, wherein the underfill adhesive is elastic and provides protection against mechanical shock and force overload applied to the device.

35. Semiconductor input control device for inputting mechanical signals into a digital system comprising:
a force sensor die formed within semiconductor substrate and providing electrical output signal in response to applied external force;
a package containing a force sensor die and comprising a force-transferring element, which is coupled to the sensor die and transfers an external force to the force sensor die;
wherein said device is mounted on an object in the location chosen from the group of: front, back, top, bottom, left side, right side, front panel, edge, control panel, control area, sidewall, handle, steering wheel, external surface, inside the object or combination of the above.

* * * * *